(12) United States Patent   (10) Patent No.: US 9,418,753 B2
Nam et al.   (45) Date of Patent: Aug. 16, 2016

(54) METHOD OF OPERATING MEMORY CONTROLLER AND DATA STORAGE DEVICE INCLUDING MEMORY CONTROLLER

(71) Applicants: Sang-Wan Nam, Hwaseong-si (KR); Kitae Park, Seongnam-si (KR)

(72) Inventors: Sang-Wan Nam, Hwaseong-si (KR); Kitae Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 458 days.

(21) Appl. No.: 14/073,155

(22) Filed: Nov. 6, 2013

(65) Prior Publication Data
US 2014/0310448 A1   Oct. 16, 2014

(30) Foreign Application Priority Data
Apr. 12, 2013 (KR) .................. 10-2013-0040221

(51) Int. Cl.
*G06F 11/00* (2006.01)
*G11C 16/34* (2006.01)
*G11C 11/56* (2006.01)
*G06F 11/14* (2006.01)

(52) U.S. Cl.
CPC ........ *G11C 16/3445* (2013.01); *G11C 11/5628* (2013.01); *G11C 16/3495* (2013.01); *G06F 11/1402* (2013.01)

(58) Field of Classification Search
CPC .................. G06F 11/1402; G11C 16/3495
See application file for complete search history.

(56) References Cited

U.S. PATENT DOCUMENTS

| 5,586,075 | A | 12/1996 | Miwa |
| 5,615,148 | A | 3/1997 | Yamamura et al. |
| 7,095,657 | B2 | 8/2006 | Takase et al. |
| 7,495,957 | B2 | 2/2009 | Futatsuyama |
| 7,515,481 | B2 | 4/2009 | Aritome |
| 7,606,080 | B2 | 10/2009 | Lee |
| 8,213,240 | B2 | 7/2012 | Kim |
| 2011/0194357 | A1 | 8/2011 | Han et al. |
| 2012/0051143 | A1 | 3/2012 | Yoon et al. |
| 2014/0281133 | A1* | 9/2014 | Karamcheti ........ G06F 12/0246 711/103 |

FOREIGN PATENT DOCUMENTS

| JP | 2008117504 A | 5/2008 |
| KR | 19970003247 | 1/1997 |

* cited by examiner

*Primary Examiner* — Zachary K Huson
(74) *Attorney, Agent, or Firm* — Harness, Dickey & Pierce

(57) ABSTRACT

In one embodiment, the method includes determining, at the memory controller, a status of a selected page of memory based on a program/erase cycle count for a block of the memory. The block of the memory includes the selected page. The program/erase cycle count indicates a number of times the block has been erased. The status is selected from a plurality of status states. The status states include a normal state, a weak state and a bad state.

33 Claims, 20 Drawing Sheets

Fig. 4
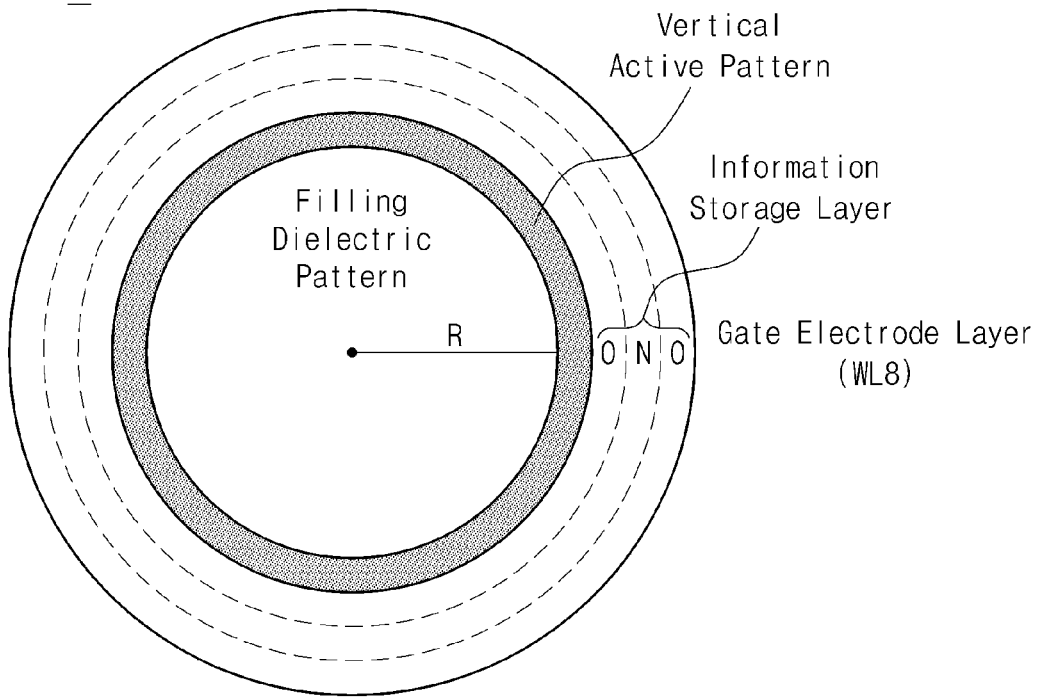
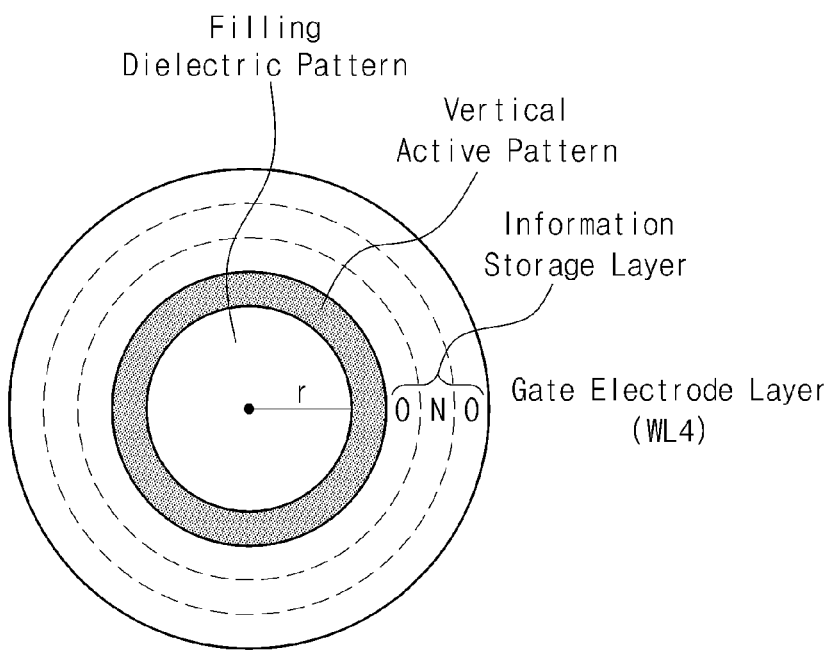

Fig. 10

| WL \ SSL | SSL1 | SSL2 | SSL3 |
|---|---|---|---|
| WL8 | 81 | 82 | 83 |
| WL7 | 71 | 72 | 73 |
| WL6 | 61 | 62 | 63 |
| WL5 | 51 | 52 | 53 |
| WL4 | 41(W) | 42(B) | 43(W) |
| WL3 | 31 | 32 | 33 |
| WL2 | 21 | 22 | 23 |
| WL1 | 11 | 12 | 13 |

Page Number

Fig. 12

| SSL\WLa | SSL1 | SSL3 | SSL2 | SSL4 | SSL\WLb |
|---|---|---|---|---|---|
| WL8a | 81 | 83 | 82 | 84 | WL8b |
| WL7a | 71 | 73 | 72 | 74 | WL7b |
| WL6a | 61 | 63 | 62 | 64 | WL6b |
| WL5a | 51 | 53 | 52 | 54 | WL5b |
| WL4a | 41(W) | 43(B) | 42 | 44 | WL4b |
| WL3a | 31 | 33 | 32 | 34 | WL3b |
| WL2a | 21 | 23 | 22 | 24 | WL2b |
| WL1a | 11 | 13 | 12 | 14 | WL1b |

Fig. 13

| SSL\WLa | SSL1 | SSL3 | SSL2 | SSL4 | SSL\WLb |
|---|---|---|---|---|---|
| WL8a | 81 | 83 | 82 | 84 | WL8b |
| WL7a | 71 | 73 | 72 | 74 | WL7b |
| WL6a | 61 | 63 | 62 | 64 | WL6b |
| WL5a | 51 | 53 | 52 | 54 | WL5b |
| WL4a | 41(W1) | 43(B) | 42(W2) | 44(W2) | WL4b |
| WL3a | 31 | 33 | 32 | 34 | WL3b |
| WL2a | 21 | 23 | 22 | 24 | WL2b |
| WL1a | 11 | 13 | 12 | 14 | WL1b |

METHOD OF OPERATING MEMORY CONTROLLER AND DATA STORAGE DEVICE INCLUDING MEMORY CONTROLLER

CROSS-REFERENCE TO RELATED APPLICATIONS

A claim for priority under 35 U.S.C. §119 is made to Korean Patent Application No. 10-2013-0040221 filed Apr. 12, 2013, in the Korean Intellectual Property Office, the entire contents of which are hereby incorporated by reference.

BACKGROUND

The inventive concepts described herein relate to method of operating a memory controller and/or a data storage device including a memory controller Semiconductor memory devices may include volatile memory devices such as a DRAM, an SRAM, and the like and nonvolatile memory devices such as an EEPROM, a FRAM, a PRAM, an MRAM, flash memory, and the like. While the volatile memory devices lose data stored therein at power-off, the nonvolatile memory devices may retain data stored therein even at power-off. In particular, the flash memory may have merits such as fast program speed, low power consumption, storage of large amounts of data, and the like. Thus, a data storage device including the flash memory may be widely used as a data storage medium.

Flash memory may be divided into a two-dimensional flash memory and a three-dimensional flash memory. In the two-dimensional flash memory, memory cells may be formed in parallel with a substrate. In the three-dimensional flash memory, memory cells may be formed in a direction perpendicular to the substrate. If a defective page is generated at a data read or write operation of the two-dimensional flash memory, a memory block including the defective page may be treated as a bad block. The bad block may not be used or may be managed to be infrequently used.

The number of memory blocks in the two-dimensional flash memory may be more than that in the three-dimensional flash memory. Also, a memory block of the two-dimensional flash memory may be larger in size than that of the three-dimensional flash memory. Although a memory block including a defective page is managed as a bad block, there may be nothing wrong with the two-dimensional flash memory. However, since the three-dimensional flash memory includes a fewer number of memory blocks and a block size of the three-dimensional flash memory is large, a problem may arise when a memory block including a defective page is managed as a bad block.

SUMMARY

At least one embodiment is related to a method of operating a memory controller.

In one embodiment, the method includes determining, at the memory controller, a status of a selected page of memory based on a program/erase cycle count for a block of the memory. The block of the memory includes the selected page. The program/erase cycle count indicates a number of times the block has been erased. The status is selected from a plurality of status states. The status states include a normal state, a weak state and a bad state.

In one embodiment, the method further includes performing the determining after a program operation on the selected page.

In one embodiment, the determining determines the status state of the selected page based on a loop count and the program/erase cycle count if the program operation is successful. The loop count indicates a number of program loops executed during the program operation. For example, the determining determines the status state of the selected page as the weak state if the loop count is greater than a first threshold and the program/erase cycle count is less than a second threshold.

In one embodiment, the determining determines the status state of the selected page based on an error correction indicator and the program/erase cycle count if the program operation is successful. The error correction indicator indicates a number of bit errors associated with the selected page. For example, the determining determines the status state of the page as the weak state if the error correction indicator is greater than a first threshold and the program/erase cycle count is less than a second threshold.

In one embodiment, the determining includes determining the status states of pages related to the selected page based on the program/erase cycle count if the program operation fails. The related pages are at a same layer and in the block of the selected page. For example, the determining determines the status states of the related pages as the weak state if the program/erase cycle count is greater than or equal to a threshold. Also, the determining may determine the status state of the selected page as the bad state if the program/erase cycle count greater than or equal to the threshold.

As another example, the determining determines the status states of the related pages as the bad state if the program/erase cycle count less than a threshold. Also, the determining may determine the status state of the selected page as the bad state if the program/erase cycle count is less than the threshold.

In one embodiment, the determining determines the status state of the selected page as the weak state if a program condition is met and the program/erase cycle count is less than a threshold. For example, the program condition may be based on a loop count, and the loop count indicates a number of program loops executed during a successful program operation of the selected page. In another example, the program condition is based on an error correction indicator, and the error correction indicator indicates a number of bit errors associated with the selected page after a successful program operation on the selected page.

In one embodiment, the determining includes determining the status states of pages related to the selected page based on the program/erase cycle count if a program condition is met. The related pages are at a same layer and in the block of the selected page. For example, the program condition is based on a loop count, and the loop count indicating a number of program loops executed during a program operation of the selected page.

In one embodiment, the method further includes managing the memory based on the determined status of the selected page. For example, the managing includes closing the selected page if the determining determines the status state of the selected page is the weak state. The closing permits reading of the closed page and prohibits writing of the closed page. Also, the closed page may not be read if the closed page is an erased page. In another example, the managing includes copying data of the selected page to a new page and inhibiting further access to the selected page if the determining determines the status state of the selected page is the bad state. In still another example, the managing includes performing an erase verify operation on an erased block including the selected page based on the determined status of the selected page. The erase verify operation includes applying voltages to word lines of the erased block based on the determined status of the selected page. For example, the erase verify operation includes applying a different voltage to word lines associated with at least one page having the bad state than applied to word lines associated with pages not having the bad state. More specifically, the erase verify operation may include applying a first voltage to word lines associated with at least one page having the bad state that is greater than a second voltage applied to word lines associated with no pages having the bad state. In another example, the erase verify operation includes applying a first voltage to word lines associated with no pages having the bad state in the erased block if the number of word lines associated with at least one page having the bad state in the erased block is less than a threshold number, and the erase verify operation includes applying a second voltage to word lines associated with no pages having the bad state in the erased block if the number of word lines associated with at least one page having the bad state in the erased block is greater than or equal to the threshold number. Here, the second voltage is less than first voltage. In this example, the erase verify operation may further include applying a third voltage to word lines associated with at least one page having the bad state in the erased block, and the third voltage is greater than the first and second voltages.

In another embodiment of the method of operating a memory controller, the method includes performing an erase verify operation on an erased block of a memory based on bad page information. The bad page information indicates which pages in a memory are bad pages. The erase verify operation includes applying a different voltage to word lines associated with at least one bad page than applied to word lines associated with no bad pages.

In one embodiment, a first voltage applied to word lines associated with at least one bad page during the erase verify operation is greater than a second voltage applied to word lines associated with no bad pages during the erase verify operation.

In one embodiment, the erase verify operation includes applying a first voltage to word lines associated with no bad pages in the erased block if the number of word lines associated with at least one bad page in the erased block is less than a threshold number, and the erase verify operation includes applying a second voltage to word lines associated with no bad pages in the erased block if the number of word lines associated with at least one bad page in the erased block is greater than or equal to the threshold number. Here, the second voltage is less than first voltage.

In one embodiment, the erase verify operation includes applying a third voltage to word lines associated with at least one bad page in the erased block, and the third voltage is greater than the first and second voltages.

At least one embodiment is directed to a data storage device.

In one embodiment, the data storage device includes a memory having a plurality of memory cells divided into blocks, and the blocks of memory cells are divided into pages. The data storage device further includes a memory controller configured to determine a status of a selected one of the pages based on a program/erase cycle count for the one of the blocks including the selected page. The program/erase cycle count indicates a number of times the block has been erased. The status is selected from a plurality of status states. The status states include a normal state, a weak state and a bad state.

In another embodiment, the data storage device includes a memory having a plurality of memory cells divided into blocks. The blocks have a three dimensional structure. The three dimensional structure includes a plurality of strings of memory cells arranged in an array of columns and rows on a substrate. Each of the plurality of strings extends substantially perpendicular to the substrate and each of the plurality of strings includes a plurality of memory cells connected in series. The plurality of memory cells of each of the plurality of strings are at different vertical layers. The structure further includes a plurality of word lines. The plurality of word lines are arranged at the different vertical layers such that each of the plurality of word lines is associated with memory cells at a same one of the vertical layers. A row of memory cells in different strings at the same one of the vertical layers forms a page. The structure also includes a plurality of bit lines. Each of the plurality of bit lines is connected to a respective column of the plurality of strings. The data storage device further includes a memory controller configured to determine a status of a selected page based on a program/erase cycle count for the one of the blocks including the selected page. The program/erase cycle count indicates a number of times the block has been erased. The status is selected from a plurality of status states, and the status states include a normal state, a weak state and a bad state.

In one embodiment, the memory controller is configured to set pages related to a bad page to the weak state. Here, the bad page has the bad state, and the related pages are pages in a same block and at a same vertical layer as the bad page.

In one embodiment, the pages at a same vertical layer in the same block are connected to a same word line.

In one embodiment, at least two of the pages at a same vertical layer in the same block are connected to different word lines.

In another embodiment of the data storage device, the data storage device includes a memory having a plurality of memory cells divided into blocks, and the blocks of memory cells being divided into pages, and a memory controller configured to obtaining bad page information. The bad page information indicates which pages in the memory are bad pages. The memory controller is configured to perform an erase verify operation on an erased block of the memory based on the bad page information. The erase verify operation includes applying a different voltage to word lines associated with at least one bad page than applied to word lines associated with no bad pages.

In one embodiment, a first voltage applied to word lines associated with at least one bad page during the erase verify operation is greater than a second voltage applied to word lines associated with no bad pages during the erase verify operation.

In one embodiment, the erase verify operation includes applying a first voltage to word lines associated with no bad pages in the erased block if the number of word lines associated with at least one bad page in the erased block is less than a threshold number, and the erase verify operation includes applying a second voltage to word lines associated with no bad pages in the erased block if the number of word lines associated with at least one bad page in the erased block is greater than or equal to the threshold number. Here, the second voltage is less than first voltage. In one embodiment, the erase verify operation further includes applying a third voltage to word lines associated with at least one bad page in the erased block, and the third voltage is greater than the first and second voltages.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 4 is a plan view illustrating cross sections A and B of a memory block BLK1 illustrated in FIG. 3;

FIG. 10 is a diagram illustrating a bad page management table of a memory block illustrated in FIG. 9;

FIGS. 12 and 13 are diagrams illustrating bad page management tables of a memory block illustrated in FIG. 11;

DETAILED DESCRIPTION

Figure 1:
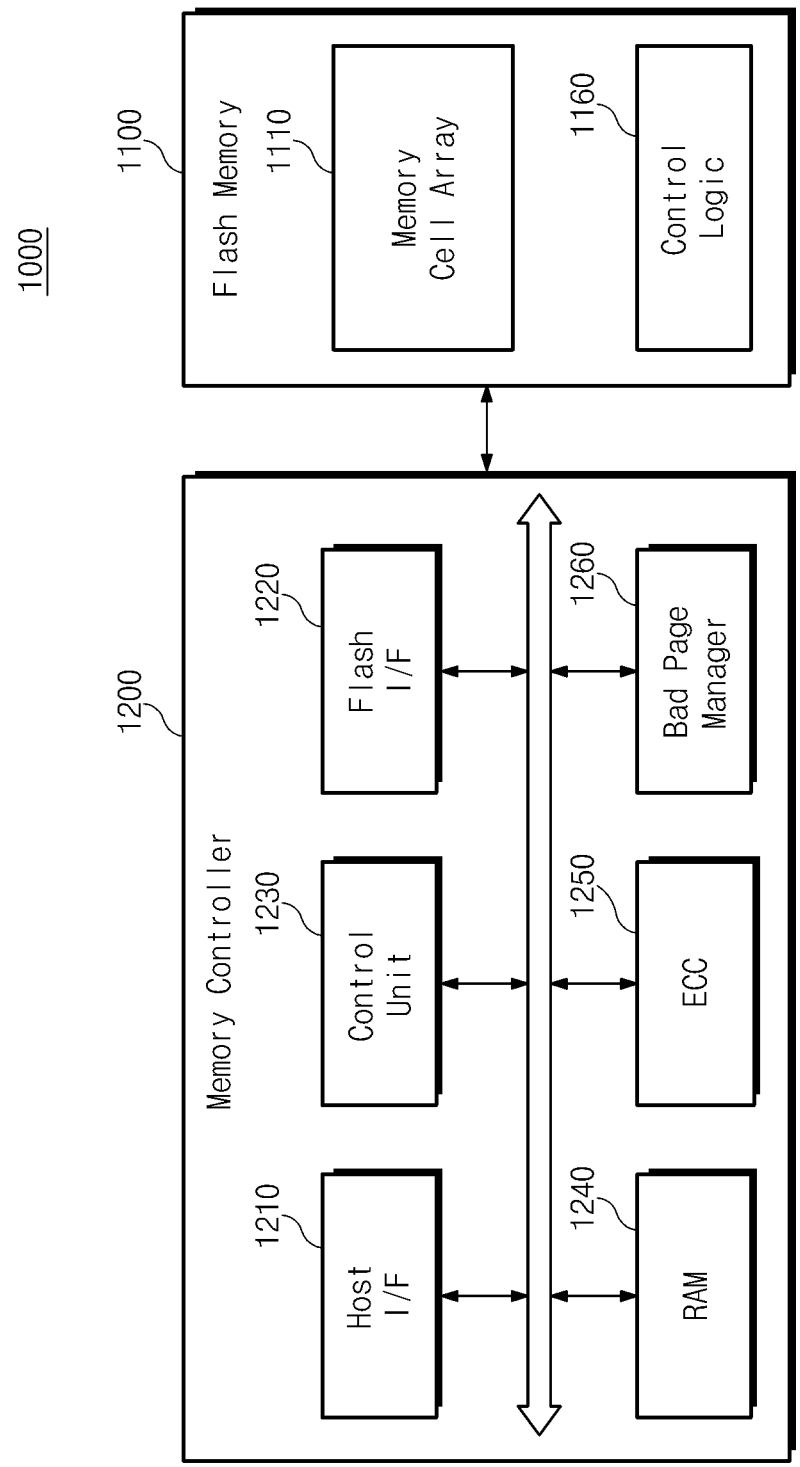
FIG. 1 is a block diagram schematically illustrating a data storage device according to an embodiment of the inventive concept.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the inventive concepts to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Data Storage Device with Bad Page Manager

FIG. 1 is a block diagram schematically illustrating a data storage device according to an embodiment of the inventive concepts. Referring to FIG. 1, a data storage device 1000 may include a flash memory 1100 and a memory controller 1200.

The data storage device 1000 may include flash memory based data storage devices such as a memory card, an USB memory, a solid state drive (SSD), and the like.

Referring to FIG. 1, the flash memory 1100 may include a memory cell array 1110 and control logic 1160. The memory cell array 1110 may include a number of memory blocks which have a three-dimensional structure (or, a vertical structure) formed in a direction perpendicular to a substrate. The control logic 1160 may control erase, write and read operations of the flash memory 1100 using a command, an address and a control signal.

The memory controller 1200 may control erase, read and write operations of the flash memory 1100 in response to a request of a host. The memory controller 1200 may include a host interface 1210, a flash interface 1220, a control unit 1230, a RAM 1240, an ECC circuit 1250, and a bad page manager 1260.

The memory controller 1200 may exchange data with the host through the host interface 1210 and with the flash memory 1100 through the flash interface 1220. The host interface 1210 may be connected with the host through a parallel ATA bus, a serial ATA bus, an SCSI, an USB, a PCIe, and the like.

The control unit 1230 may control an overall operation (e.g., a read operation, a write operation, a file system management operation, a bad page management operation, etc.) of the flash memory 1100. For example, although not shown in FIG. 1, the control unit 1230 may include a CPU, a processor, an SRAM, a DMA controller, and the like.

The RAM 1240 may operate responsive to the control of the control unit 1230 and may be used as a work memory, a buffer memory, a cache memory, and the like. When the RAM 1240 is used as the work memory, data processed by the control unit 1230 may be temporarily stored at the RAM 1240. When the RAM 1240 is used as the buffer memory, it may buffer data to be transferred from the flash memory 1100 to the host or from the host to the flash memory 1100. When the RAM 1240 is used as the cache memory, it may enable the low-speed flash memory 1100 to appear to operate at high speed.

The ECC circuit 1250 may generate an error correction code for correcting a fail bit or an error bit of data received from the flash memory 1100. The ECC circuit 1250 may generate data, to which a parity bit is added, by performing error correction encoding on data provided to the flash memory 1100. The parity bit may be stored at the flash memory 1100.

The ECC circuit 1250 may perform error correction decoding on data output from the flash memory 1100. The ECC circuit 1250 may correct an error using parity information. The ECC circuit 1250 may correct an error using coded modulation such as LDPC (low density parity check) code, BCH code, turbo code, RS (Reed-Solomon) code, convolution code, RSC (recursive systematic code), TCM (trellis-coded modulation), BCM (Block coded modulation), and so on.

The ECC circuit 1250 may have an allowable error correction range. For example, the ECC circuit 1250 may correct a 40-bit error with respect to 2 KB-page data maximally. That is, when the number of error bits is more than 40 bits, the ECC circuit 1250 may not correct an error in a page. The uncorrectable page may be referred to as a defective page. An erroneous memory cell in the defective page may be referred to as a defective cell.

In general, a flash memory may manage a memory block including a defective page as a bad block, and may not use the bad block any more. The number of memory blocks in a two-dimensional flash memory may be more than that in a three-dimensional flash memory. Also, a memory block of the two-dimensional flash memory may be smaller in size than that of the three-dimensional flash memory. Although a memory block including a defective page is managed as a bad block, there may be nothing wrong with the two-dimensional flash memory. However, since the three-dimensional flash memory includes a fewer number of memory blocks and a block size of the three-dimensional flash memory is large, a problem (e.g., a lot of data loss) may arise when a page is a defective page and a memory block including the defective page is managed as a bad block.

The data storage device 1000 according to an embodiment of the inventive concepts may not perform a bad block management operation by the memory block unit, but perform a bad page management operation by the page unit. The bad page manager 1260 may perform a bad page management operation and be implemented by software or hardware. In the event that the bad page manager 1260 is implemented by software, the algorithm may be stored at the flash memory 1100 or the memory controller 1200 and executed by the control unit 1230 or separate processor after being shared in the RAM 1240 when the bad page management operation is required.

The bad page manager 1260 may determine the status of pages. For example, the bad page manager 1260 may determines the status from a plurality of status states. The status states may include a normal state, a bad state and a weak state. Pages are originally designated as having the normal state. If the bad page manager 1260 determines a page is bad, then the bad page manager assigns the bad state. The bad state generally indicates that the page should no longer be written to or read from. As will be described in detail below, the bad page manager 1260 may determine whether a page is bad based on whether a program operation on the page fails and/or the program/erase cycle count of the block including the page. The program/erase (P/E) cycle count indicates the number of times the block has been erased. If the bad page manager 1260 determines a page is weak, then the bad page manager 1260 assigns the weak state. The weak state generally indicates that the page should no longer be written to, but may still be read from. As will be described in detail below, the bad page manager 1260 may determine whether a page is weak based on whether a program operation on the page fails, the program loop count for programming the page, and/or the program/erase cycle count of the block including the page. The bad page manager 1260 may also determine that pages related to a bad page may be designated as weak pages. For example, the related page is at a same height or layer as the bad page such as with a flash memory having a three-dimensional structure. This and the operation of the bad page manger 1260 will be described in greater detail below.

The data storage device 1000 according to an embodiment of the inventive concepts may perform a bad block management operation by the page unit. Thus, data loss may be reduced and memory cells may be efficiently used.

Figure 2:
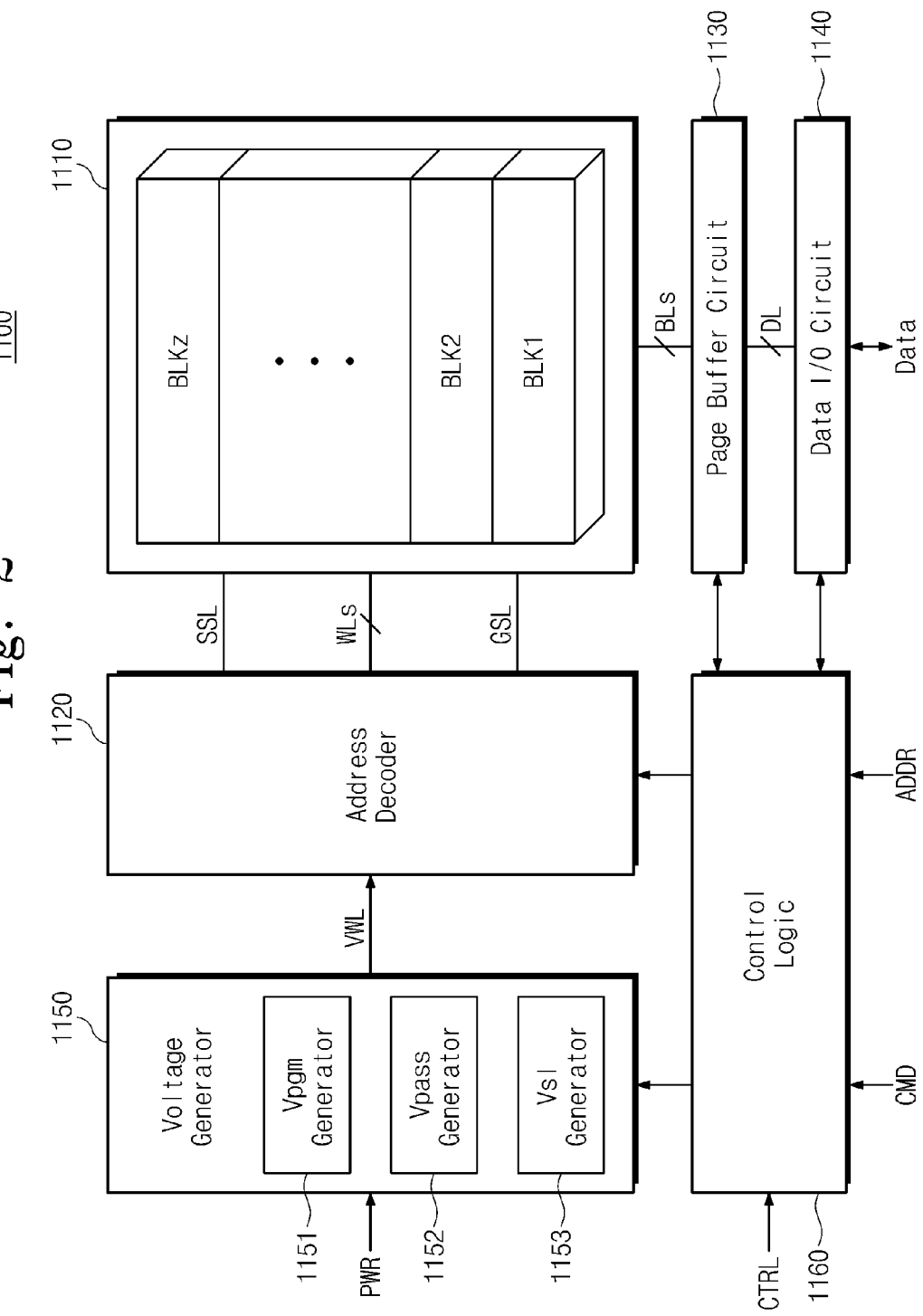
FIG. 2 is a block diagram schematically illustrating a flash memory in FIG. 1.

FIG. 2 is a block diagram schematically illustrating a flash memory in FIG. 1. Referring to FIG. 2, a flash memory 1100 may include a memory cell array 1110, an address decoder 1120, a page buffer circuit 1130, a data input/output circuit 1140, a voltage generator 1150, and control logic 1160.

The memory cell array 1110 may be formed of a plurality of memory blocks BLK1 to BLKz, each of which has a three-dimensional structure (or, a vertical structure). Memory cells of a memory block having a two-dimensional structure (or, a horizontal structure) may be formed in a direction parallel with a substrate. However, memory cells of a memory block having a three-dimensional structure may be formed in a direction perpendicular to a substrate.

The address decoder 1120 may be connected to the memory cell array 1110 through selection lines SSL and GSL or word lines. The address decoder 1120 may receive a word line voltage VWL from the voltage generator 1150 and be controlled by the control logic 1160. The address decoder 1120 may select a word line at a read or program operation. A program voltage or a read voltage may be applied to the selected word line.

The page buffer circuit 1130 may be connected to the memory cell array 1110 through bit lines. The page buffer circuit 1130 may include a plurality of page buffers (not shown). A page buffer may be connected to a bit line or to two or more bit lines. The page buffer circuit 1130 may temporarily store data to be programmed or data read out from a selected page.

The data input/output circuit 1140 may be connected to the page buffer circuit 1130 through data lines DL. Further, the data input/output circuit 1140 may be connected to the memory controller 1200 (refer to FIG. 1) through input/output lines. The data input/output circuit 1140 may receive program data from the memory controller 1200 at a program operation and provide read data to the memory controller 1200 at a read operation.

The voltage generator 1150 may receive a power PWR from the memory controller 1200 to generate the word line voltage VWL to read or write data. The word line voltage VWL may be provided to the address decoder 1120. The voltage generator 1150 may generate a high voltage, higher than a power supply voltage Vcc. The high voltage may be used as a program voltage, a page voltage, and so on at a program operation, as a read voltage at a read operation, and as an erase voltage at an erase operation.

As illustrated in FIG. 2, the voltage generator 1150 may include a Vpgm generator 1151, a Vpass generator 1152, and a Vsl generator 1153. The Vpgm generator 1151 may generate a program voltage Vpgm provided to a selected word line at a program operation. The program voltage Vpgm may increase according to a number of iterations of a program loop. The Vpass generator 1152 may generate a pass voltage Vpass provided to selected and non-selected word lines at a program operation. Although a program loop is iterated, the pass voltage Vpass may be constantly maintained. The Vsl generator 1153 may generate a selection line voltage provided to the string selection line SSL or the ground selection line GSL.

The control logic 1160 may control programming, reading, and erasing of the flash memory 1100 based on a command CMD, an address ADDR, and a control signal CTRL from the memory controller 1200. For example, at programming, the control logic 1160 may control the address decoder 1120 to provide the program voltage Vpgm to a selected word line, and may control the page buffer circuit 1130 and the data input/output circuit 1140 to provide program data to a selected page.

Figure 3:
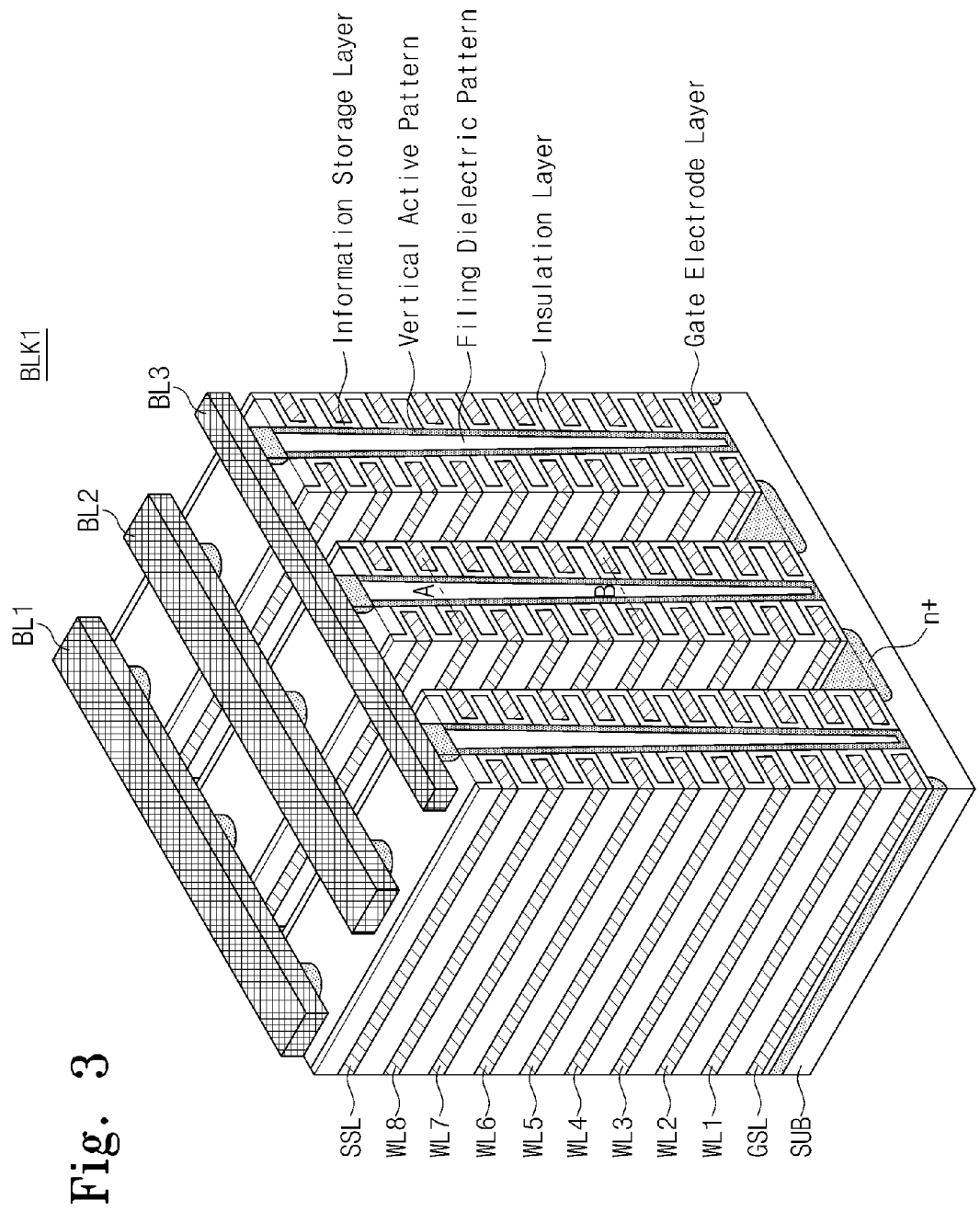
FIG. 3 is a perspective view schematically illustrating a three-dimensional structure of a memory block BLK1 illustrated in FIG. 2.

FIG. 3 is a perspective view schematically illustrating a three-dimensional structure of a memory block BLK1 illustrated in FIG. 2. Referring to FIG. 3, a memory block BLK1 may be formed in a direction perpendicular to a substrate SUB. An n+ doping region may be formed at the substrate SUB. A gate electrode layer and an insulation layer may be deposited on the substrate SUB in turn. An information storage layer may be formed between the gate electrode layer and the insulation layer.

If the gate electrode layers and the insulation layers are patterned in a vertical direction, V-shaped pillars may be formed. The pillars may be connected with the substrate SUB via the gate electrode layers and the insulation layers. An outer portion of each pillar may be formed of a channel semiconductor having a vertical active pattern.

The gate electrode layers of the memory block BLK1 may be connected with a ground selection line GSL, a plurality of word lines WL1 to WL8, and a string selection line SSL. The pillars of the memory block BLK1 may be connected with a plurality of bit lines BL1 to BL3. In FIG. 3, there is illustrated an example in which one memory block BLK1 has two selection lines SSL and GSL, eight word lines WL1 to WL8, and three bit lines BL1 to BL3. However, the inventive concepts are not limited thereto.

FIG. 4 is a plan view illustrating cross sections A and B of a memory block BLK1 illustrated in FIG. 3. A cross section A may be a plane corresponding to an eighth word line WL8 and a cross section B may be a plane corresponding to a fourth word line WL4.

Referring to the cross sections A and B, a memory cell may be formed of a filing dielectric pattern, a vertical active pattern, an information storage layer, and a gate electrode layer which are arranged sequentially from the inside. The filing dielectric pattern may be formed of silicon oxide or air gap. The vertical active pattern may be formed of a p-type silicon layer and operate as a channel of a memory cell.

The information storage layer may be formed of a tunnel insulation layer, a charge storage layer, and a blocking insulation layer. The tunnel insulation layer may act as an insulation layer through which charge moves by the tunneling effect. The charge storage layer may be formed of an insulation film that traps charge. The charge storage layer may be formed of a silicon oxide layer. Herein, the tunnel insulation layer, the charge storage layer, and the blocking insulation layer may be formed of an insulation layer to have an ONO (Oxide-Nitride-Oxide) structure.

Returning to FIG. 3, a three-dimensional flash memory may be formed by etching multiple layers of thin films at a time to form holes and forming silicon channel layers at the insides of the holes. A diameter of a hole formed through an etching process may vary according to a depth. The closer a distance from a substrate SUB, the smaller a diameter of the hole. As illustrated in FIG. 4, a radius R of a filing dielectric pattern corresponding to the eighth word line WL8 may be longer than a radius r of a filing dielectric pattern corresponding to the fourth word line WL4.

The above-described phenomenon may be based on a difference between etching depths, and may cause a characteristic difference of memory cells connected with the eighth and fourth word lines WL8 and WL4. In general, the longer a diameter of a pillar, the narrower an effective area of a gate electrode layer. In this case, resistance may increase and capacitance formed between layers may increase. Thus, as a diameter of a pillar increases, coupling capacitance and resistance of a memory cell may increase. For this reason, the eighth word line WL8 placed at the uppermost layer of a pillar may have the largest resistance and capacitance.

Memory cells formed at the same height (e.g., level or layer) may have similar cell characteristics. For example, since memory cells connected with the fourth word line WL4 have a diameter of the same pillar, their coupling capacitance and resistance may be similar. Thus, in the event that a page in the fourth word line WL4 is a bad page, the probability that the remaining pages in the fourth word line WL4 are bad pages may be high.

Also, since high voltages such as a program voltage Vpgm, a pass voltage Vpass, a read voltage Vread, an erase voltage Verase, and so on are applied to memory cells sharing the same word line, the memory cells sharing the same word line may experience the same cell stress. For this reason, a data storage device 1000 (refer to FIG. 1) according to an embodiment of the inventive concepts may manage pages at the same layer or height as a bad page, or pages sharing the same word line, as weak pages.

Figure 5:
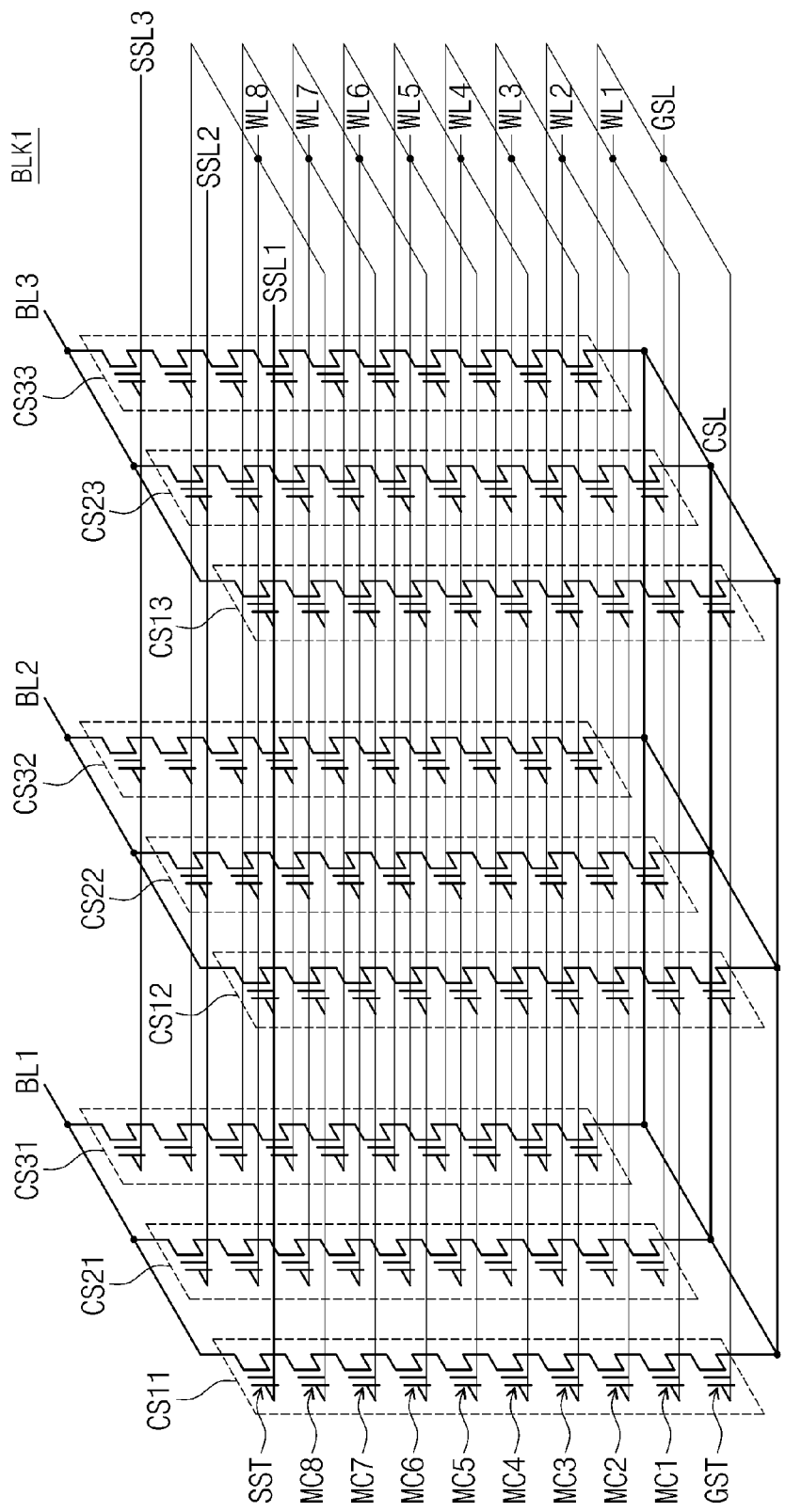
FIG. 5 is an equivalent circuit of a memory block illustrated in FIG. 3.

FIG. 5 is an equivalent circuit of a memory block illustrated in FIG. 3. Referring to FIG. 5, cell strings CS11 to CS33 may be connected between bit lines BL1 to BL3 and a common source line CSL. Each cell string (e.g., CS11) may include a string selection transistor SST, a plurality of memory cells MC1 to MC8, and a ground selection transistor GST.

The string selection transistors SST may be connected with a string selection line. The string selection transistors SST may be divided into first to third string selection lines SSL1 to SSL3. The ground selection transistors GST may be connected with a ground selection line GSL. The ground selection line GSL of each cell string may be connected. In each NAND string, the string selection transistor SST may be connected with a bit line and the ground selection transistor GST may be connected with a common source line CSL.

The memory cells MC1 to MC8 may be connected with corresponding word lines WL1 to WL8. A set of memory cells which are connected with a word line and programmed at the same time may be referred to as a page. The memory block BLK1 may be formed of a plurality of pages. Also, a word line may be connected with a plurality of pages. Referring to FIG. 5, a word line (e.g., WL4) placed at the same layer or height from the common source line CSL may be connected in common with three pages.

Each memory cell may store a data bit, or two or more data bits. A memory cell storing a data bit may be referred to as a single level cell (SLC) or a single bit cell. A memory cell storing two or more data bits may be referred to as a multi-level cell (MLC) or a multi-bit cell. In case of a 2-bit MLC, two pages of data may be stored at a physical page. Thus, six pages of data may be stored at memory cells connected with the fourth word line WL4.

Figure 6:
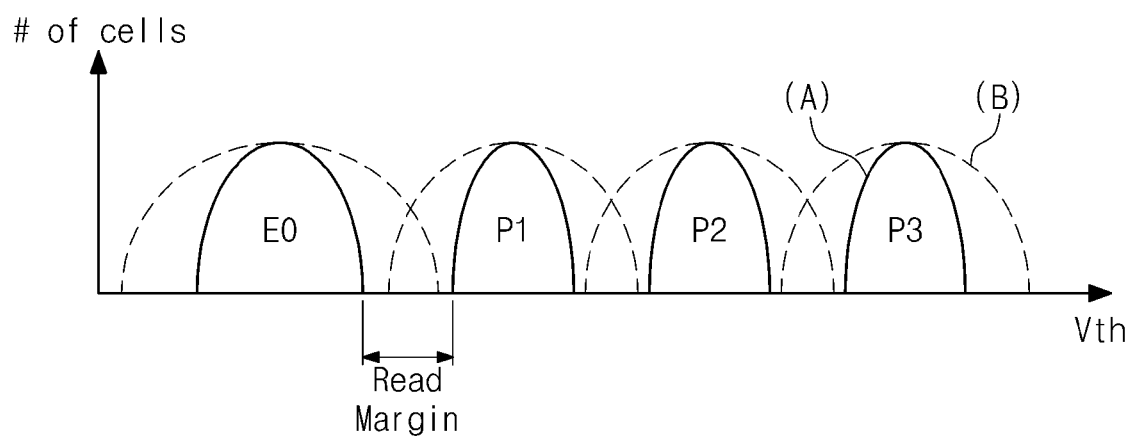
FIG. 6 is a diagram illustrating a threshold voltage distribution of 2-bit multi-level cells illustrated in FIG. 5.

FIG. 6 is a diagram illustrating a threshold voltage distribution of 2-bit multi-level cells illustrated in FIG. 5. In FIG. 6, a horizontal axis may indicate a threshold voltage and a vertical axis may indicate the number of memory cells. A 2-bit MLC may have one of four states EU, P1, P2 and P3 according to its threshold voltage.

A defect of a memory cell may be generated at a user level as well as at a fabrication level. A defect generated at the fabrication level may be referred to as an initial defect, and a defect at the user level may be referred to as a progressive defect. A memory cell having the progressive defect may be a bad cell.

In FIG. 6, a solid line A may indicate an initial state of a threshold voltage distribution and a dotted line B may indicate a final threshold voltage distribution. At an initial state, sufficient read margin may exist between adjacent program states. However, if a progressive defect is generated, adjacent program states may become overlapped. The progressive defect may be generated when data is iteratively written, erased or read and when data is written and a long time elapses.

In the event that a progressive defect is generated, a data storage device 1000 (refer to FIG. 1) according to an embodiment of the inventive concepts may not perform a bad block management operation by the memory block unit, but a bad page management operation by the page unit. Thus, data loss may be reduced and a memory may be efficiently used.

Operation of Memory Controller

Figure 7:
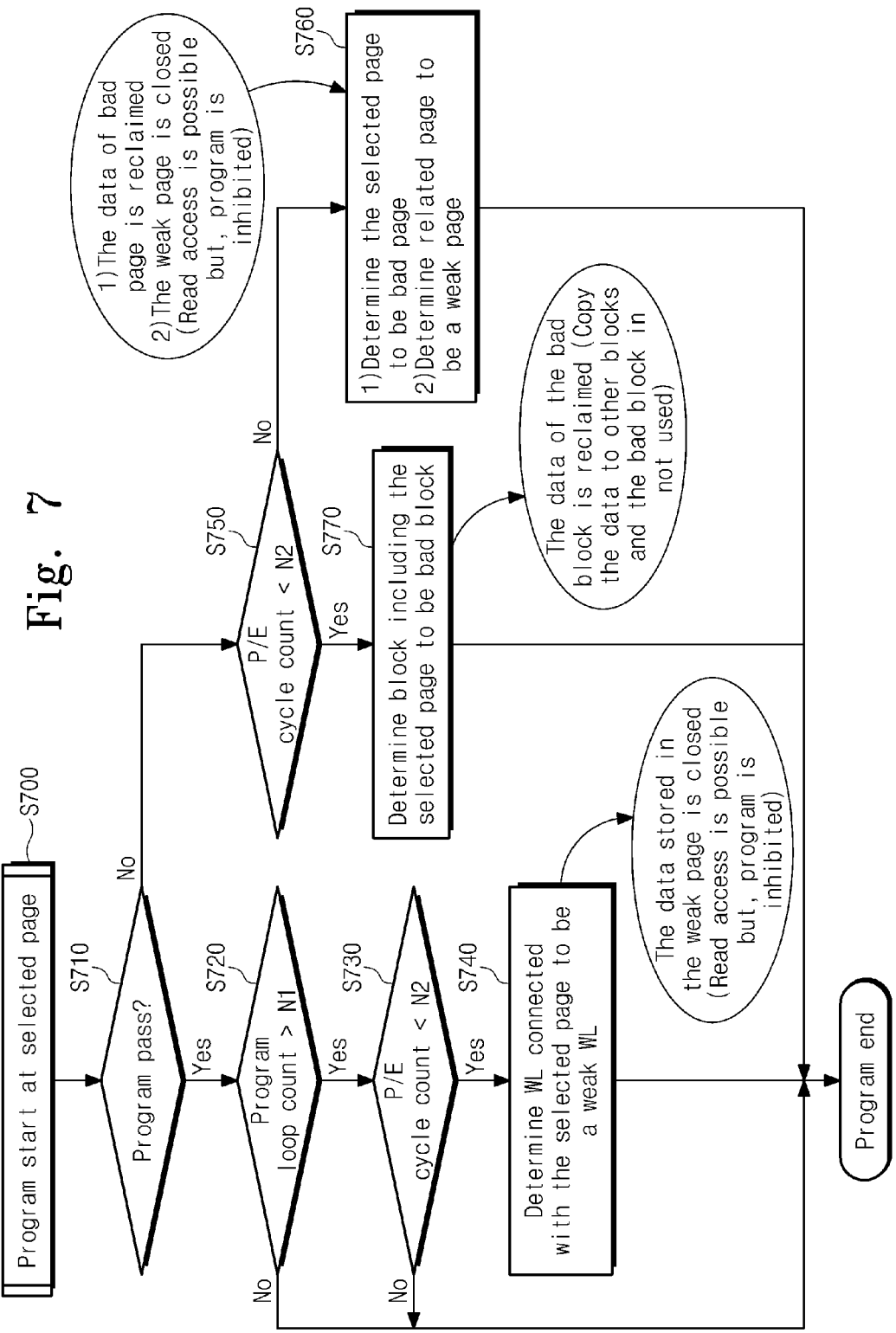
FIG. 7 illustrates a method of operating a memory controller according to an embodiment.

FIG. 7 illustrates a method of operating a memory controller according to an example embodiment. This embodiment will be described as implemented by the memory controller 1200 of FIG. 1. As shown, in step S700, the memory controller 1200 begins programming a selected page. For example, the control unit 1230 may provide the flash memory 1100 with a program command. The memory controller 1200 may provide an address and data with the program command. Herein, the address may be to select a page at which data is to be stored.

Figure 8:
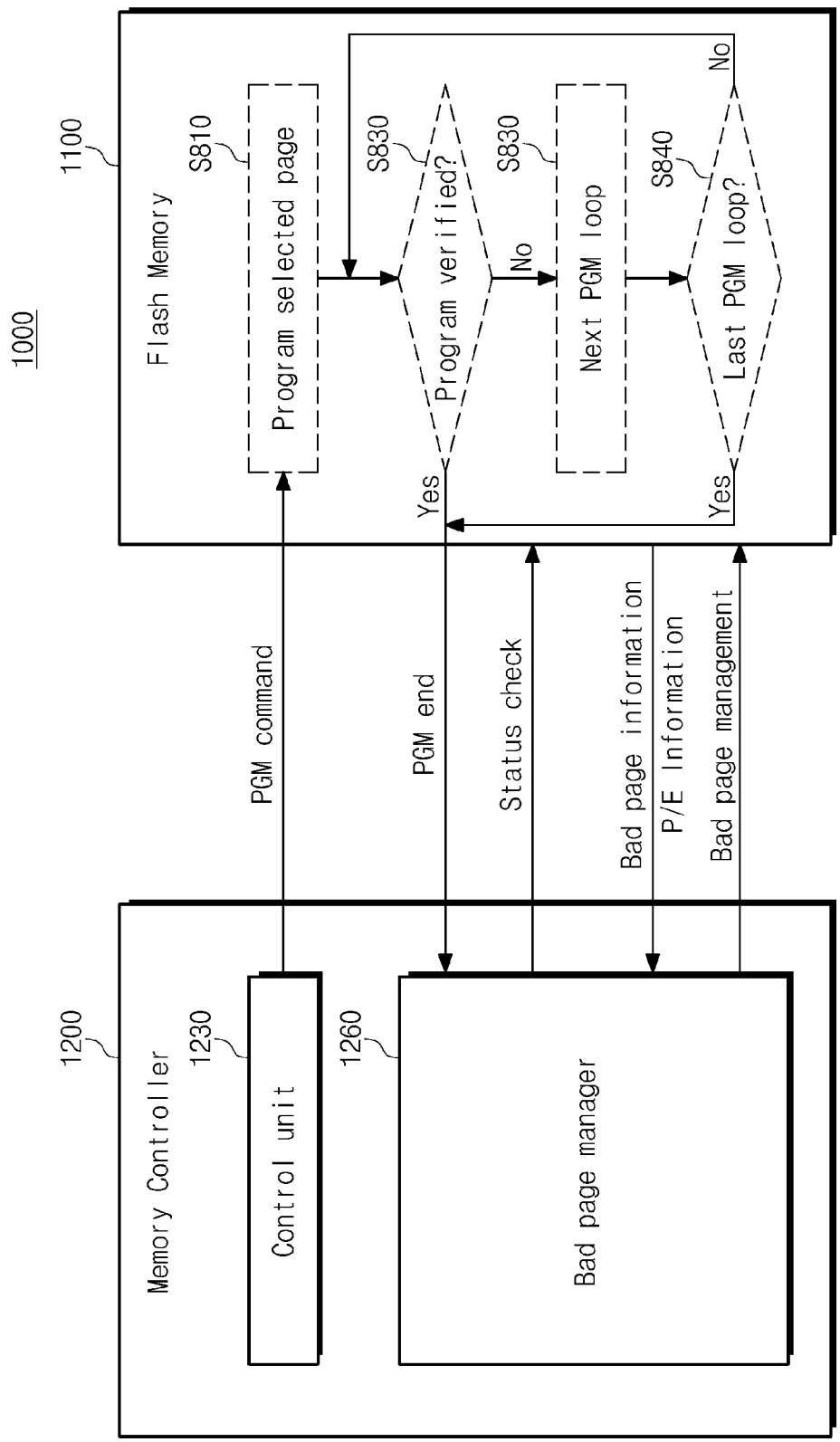
FIG. 8 illustrates a program operation according to an embodiment.

The flash memory 1100 may perform a program operation in response to the program command. FIG. 8 illustrates, in part, a flowchart of a program operation executed by the flash memory 1100. As shown, in operation S810, a selected page may be programmed. A program voltage Vpgm may be supplied to a selected word line and a pass voltage Vpass may be supplied to unselected word lines. A power supply voltage Vcc may be applied to a selected string selection line and unselected string selection lines may be grounded.

In operation S820, a program verification operation may be performed to determine whether programming is successful (e.g., pass or fail). A program verification voltage Vfy may be supplied to the selected word line and a read voltage Vread may be supplied to the unselected word lines. Herein, the read voltage Vread may be a voltage sufficient to turn all memory cells on.

If programming is not verified, in operation S830, a next program loop may be executed (e.g., programming of the data may be repeated, albeit at different program voltages). In operation S840, whether a current program loop is a last program loop may be determined. If not, the method may proceed to operation S810.

If programming is verified (e.g., passes) in operation S820, the flash memory 1100 may provide a program end signal (PGM end) to the memory controller 1200. The end signal may indicate, for example, that the program operation passed and may indicate the number of program loops (i.e., loop count or program loop number) to program the data, a current program/erase cycle count for the block including the selected page, and/or etc. The program/erase cycle count indicates a number of times the block including the selected page has been erased.

Returning to operation S840, if a current program loop is determined to be a last program loop in operation S840, the flash memory 1100 may provide a program end signal (PGM end) to the memory controller 1200. Here, the end signal may indicate the program operation has failed, indicate the number of program loops, indicate the program/erase cycle count for the block including the selected page, and/or etc. For example, if a maximum allowable program loop number of the flash memory 1100 is 20 and programming fails at the 20$^{th}$ program loop, the flash memory 1100 may end a program operation on the selected page and treat the program operation on the selected page as having failed, which will be indicated in the end signal. If a maximum allowable program loop number of the flash memory 1100 is 20 and programming passes before a 20$^{th}$ program loop, the flash memory 1100 would have provided a final program loop number in the end signal to the memory controller 1200.

As illustrated in FIG. 8, the bad page manager 1260 of the memory controller 1200 may send a status check signal to the flash memory 1200. The flash memory 1100 may provide the bad page manager 1260 with bad page information in response to the status check signal. Herein, the bad page information may include a program loop number of a page indicated in the status check signal, a block of pages indicated in the status check signal, and/or all pages in the flash memory 1100. The flash memory 1100 may also supply the bad page manager 1260 with program/erase (P/E) cycle information in response to the status check signal. Herein, the P/E information may include the P/E cycle count for a block including a page indicated in the status check signal, the P/E cycle counts for more than one block indicated in the status check signal, and/or the P/E cycle counts for all blocks in the flash memory 1100.

Returning to FIG. 7, after a program operation on a selected page in step S700, the bad page manager 1260 may perform a management operation beginning at step S710. In particular, in step S710, the bad page manager 1260 determines whether the program operation passed (e.g., was successful). For example, the program end signal indicates whether the program operation on the selected page passed or failed, and the bad page manager 1260 determines whether the program operation passed based on the program end signal.

If the program operation passed, then in step S720, the bad page manager 1260 determines if the program loop count (i.e., number of program loops) for the selected page exceeds a first threshold N1. As will be appreciated, the end signal provides the program loop count. If the program loop count does not exceed the first threshold N1, the management operation ends. It will be appreciated that the first threshold may be a design parameter determined through empirical study.

If the program loop count does exceed the first threshold N1, then in step S730, the bad page manager 1260 determines if the P/E cycle count for the block including the selected page is less than a second threshold N2. If the P/E cycle count is less than the second threshold N2, the management operation ends. It will be appreciated that the second threshold may be a design parameter determined through empirical study.

If the P/E cycle count is less than the second threshold N2, then in step S740, the bad page manager 1260 determines that the status state of the selected page is the weak state. Here, the bad page manager 1260 determines that the selected page has an initial defect.

As described in more detail below, the bad page manager 1260 may maintain a table indicating the status states of the pages. This table may be stored in the flash memory 1100 during power off, and obtained by the bad page manager 1260 during power on. During operation, the bad page manager 1260 may update the table according to the embodiment of FIG. 7. Alternatively, the bad page manager 1260 may update the table stored in the flash memory 1100. During reading and writing operations, the memory controller 1200 may perform reading and writing operations based on the status state information in the status state table. For example, for a page having the weak state, the memory controller 1200 will continue to permit read access to the page, but will prohibit writing (i.e., programming) the page. Accordingly, the weak page may be referred to as a closed page.

Returning to step S710, if the program operation on the selected page did not pass, then in step S750, the bad page manager 1260 determines if the P/E cycle count for the block including the selected page is less than the second threshold N2. If the P/E cycle count is not less than the second threshold N2, then in step S760, the bad page manager 1260 determines the status state of (1) the selected page as the bad state and (2) the pages related to the selected page as the weak state. Related pages are pages at the same layer as the selected page. Here, the bad page manager 1260 determines that the selected page has a progressive defect. The status states are recorded in the status state table. As described above, for a page having the weak state, the memory controller 1200 will continue to permit read access to the page, but will prohibit writing (i.e., programming) the page. For a page having the bad state, the memory controller 1200 will perform a read reclaim operation on the page. The read reclaim operation copies the data of the bad page to a new, normal page. After the read reclaim operation, the memory controller 1200 will no longer access (read or write) the bad page.

Returning to step S750, if the P/E cycle count is less than the second threshold N2, then in step S770, the bad page manager 1260 determines that the status state of all pages in the block including the selected page to be the bad state. Namely, the entire block including the selected page is determined to be the bad state. Accordingly, the memory controller 1200 will perform a read reclaim operation on the bad pages, and then the memory controller 1200 will no longer access (read or write) the bad pages. Here, the bad page manager 1260 had determined that the selected page has an initial defect.

Figure 9:
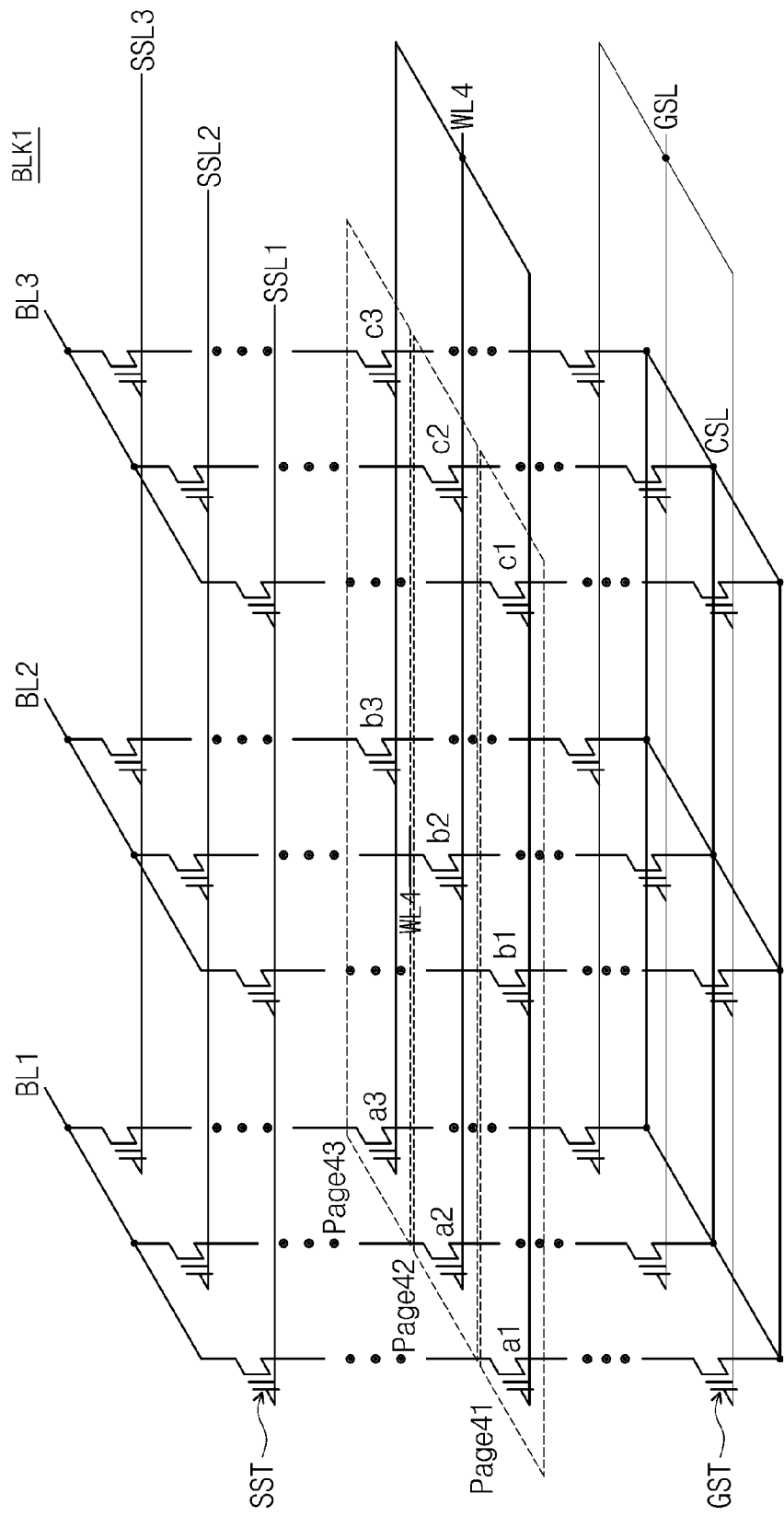
FIG. 9 is a detailed circuit diagram illustrating a fourth word line of a memory block in FIG. 5.

FIG. 9 is a detailed circuit diagram illustrating a fourth word line of a memory block in FIG. 5. Referring to FIG. 9, a fourth word line WL4 may be connected with three pages page41, page42, and page43 that are formed at the same height of layer from a substrate. The pages page41, page42, and page43 may be selected by string selection lines SSL1 to SSL3, respectively.

The page page41 may be formed of memory cells a1, b1, and c1 and selected by the first string selection line SSL1. The page page42 may be formed of memory cells a2, b2, and c2 and selected by the second string selection line SSL2. The page page43 may be formed of memory cells a3, b3, and c3 and selected by the third string selection line SSL3. It is assumed that the page page42 is a bad page. In this case, at least one of the memory cells a2, b2, and c2 may be a bad cell.

A bad page manager 1260 (refer to FIG. 1) may manage the remaining pages page41 and page43, sharing the same word line WL4 as the bad page page42, as weak pages. In this case, the bad page manager 1260 may manage the bad page page42 as a page not to be used and the page41 and page43 as weak pages to be used restrictively at a read operation. The bad page manager 1260 may have a status state or bad page management table, which records the status states of the pages for page management.

FIG. 10 is a diagram illustrating a status state or bad page management table for a memory block such as illustrated in FIG. 9. The bad page manager 1260 (refer to FIG. 1) may have a bad page management table to perform a bad page management operation by the page unit.

Referring to FIG. 10, a bad page management table may include page numbers on each word line. Pages connected with each word line may be distinguished by a string selection line. A first word line WL1 may be connected with pages 11, 12, and 13. The page 11 may be selected by a first string selection line SSL1, the page 12 may be selected by a second string selection line SSL2, and the page 13 may be selected by a third string selection line SSL3.

If the bad page manager 1260 determines a page 42 connected with a fourth word line WL4 has the bad state, the page 42 may be marked by a bad page mark B in the table. The bad page manager 1260 may mark a weak page mark W in the table for the remaining pages page41 and page43 sharing a word line with the bad page 41.

The bad page manager 1260 may control writing, reading and erasing on a bad or weak page based on the bad page management table. For example, if writing or reading on the bad page page42 is requested, the bad page manager 1260 may inhibit writing or reading on the bad page page42. In this case, the bad page manager 1260 may copy data to another page through a copy-back operation. In case of the weak page page41, the bad page manager 1260 may inhibit a write operation and allow a read operation only. Thus, a frequency of using a weak page may be limited.

As described above, memory cells formed at the same height may have similar cell characteristics. Also, since high voltages such as a program voltage Vpgm, a pass voltage Vpass, a read voltage Vread, an erase voltage Verase, and so on are applied to memory cells sharing the same word line, the memory cells sharing the same word line may experience the same cell stress. If a page connected with the same word line becomes a bad page, the probability that the remaining pages become a bad page may be high. For this reason, the bad page manager 1260 may manage pages placed at the same height or layer as a bad page or connected with the same word line as weak pages.

Figure 11:
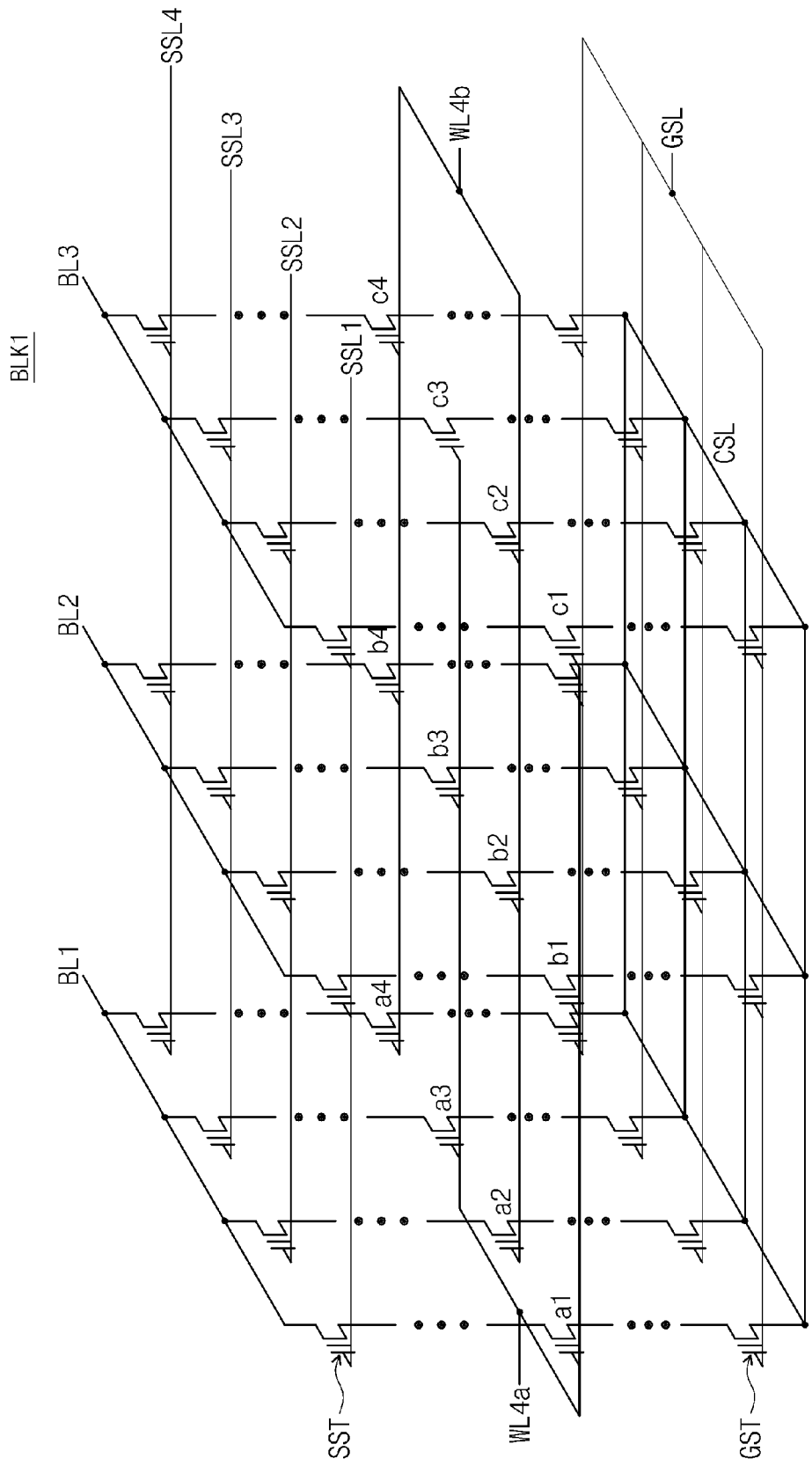
FIG. 11 is a circuit diagram illustrating a three-dimensional flash memory having pages formed at the same height and not sharing a word line.

FIG. 11 is a circuit diagram illustrating a three-dimensional flash memory having pages formed at the same height or layer and not sharing a word line. Referring to FIG. 11, four pages formed at the same height from a substrate may be connected. The pages may be distinguished by string selection lines SSL1 to SSL4.

A page 41 may be formed of memory cells a1, b1 and c1 and selected by a first string selection line SSL1. A page 42 may be formed of memory cells a2, b2 and c2 and selected by a second string selection line SSL2. A page 43 may be formed of memory cells a3, b3 and c3 and selected by a third string selection line SSL3. A page 44 may be formed of memory cells a4, b4 and c4 and selected by a fourth string selection line SSL4. Herein, the pages 41 and 43 may be connected with a word line WL4a and the pages 42 and 44 may be connected with a word line WL4b.

A bad page manager 1260 may manage the page 41 sharing the same word line WL4a with a bad page (e.g., page43) as a weak page. Also, the bad page manager 1260 may manage the pages page41, page42, and page44 placed at the same height with the bad page page43 as weak pages. In this case, the bad page manager 1260 may designate page page41, connected with the same word line WL4a as the bad page page43, as a weak page; and may designate the pages page42 and page44, connected with the word line WL4b different from the bad page page43 but at a same layer, as weak pages to perform a bad page management operation.

FIGS. 12 and 13 are diagrams illustrating bad page management tables of a memory block illustrated in FIG. 11. Referring to FIGS. 12 and 13, a word line WL4a may be connected with pages 41 and 43.

The page 41 may be selected by a first string selection line SSL1, and the page 43 may be selected by a third string selection line 55L3. A word line WL4b may be connected with pages 42 and 44. The page 42 may be selected by a second string selection line 55L2, and the page 44 may be selected by a fourth string selection line SSL4.

Referring to FIG. 12, if the bad page manager 1260 determines a page 43 connected with a word line WL4a to be a bad page based on bad page information, a bad page mark B may be recorded for the page 43 in the table. The bad page manager 1260 may record a weak page mark W for the remaining page page41 sharing a word line with the bad page 43, in the table.

Since a high voltage such as a read voltage Vread and so on is applied to memory cells sharing the same word line, the memory cells sharing the same word line may experience the same cell stress. If a page connected with the same word line becomes a bad page, the probability that the remaining pages become a bad page may be high. For this reason, the bad page manager 1260 may manage pages, connected with the same word line as a bad page, as weak pages.

Referring to FIG. 13, the bad page manager 1260 may record in the table a first weak page mark W1, for page41, connected with the same word line WL4a as the bad page page43, and a second weak page mark W2 for pages page42 and page44, connected with another word line WL4b. Since memory cells formed at the same height or layer have similar cell characteristics, the bad page manager 1260 may manage a page, which is connected with a word line different from a bad page and is formed at the same height, as a weak page.

The bad page manager 1260 may control the flash memory 1100 such that writing, reading and erasing on a bad page is different from pages marked as first and second weak pages, based on a bad page management table. For example, the bad page manager 1260 may inhibit reading and writing on a bad page page43, allow a read operation on the first weak page page41, and use memory cells in the second and third weak pages page42 and page44 as single level cells.

Memory Block Erasing Management Method

At an erase operation, a flash memory 1100 (refer to FIG. 2) may apply a voltage of 0V to word lines and an erase voltage Verase (e.g., about 20V) to a substrate SUB. After the erase operation is performed, an erase verification operation may be performed to determine whether memory cells have threshold voltages corresponding to an erase state EU (refer to FIG. 6). At the erase verification operation, an erase verification result may be determined as failed always due to a bad page.

A data storage device 1000 (refer to FIG. 1) according to an embodiment of the inventive concepts may prevent erase verification from failing due to a word line connected with a bad page by applying a desired (or, alternatively a predetermined) voltage (e.g., Vread) to the "bad" word line. A bad page manager 1260 may obtain bad word line information through the above-described bad page information. Namely, the bad page manager 1260 determines which pages have the bad state from the status state or bad page management table. Word lines connected to a bad page are determined by the bad page manager 1260 to be bad word lines. The bad page manager 1260 may inform the flash memory 1100 of the bad word lines, or may store the information on the bad word lines in a designated portion of the flash memory 1100. Alternatively, the status state table may be stored in the flash memory 1100, and the flash memory 1100 directly identifies the bad word lines as those connected to pages having the bad status state.

Figure 14:
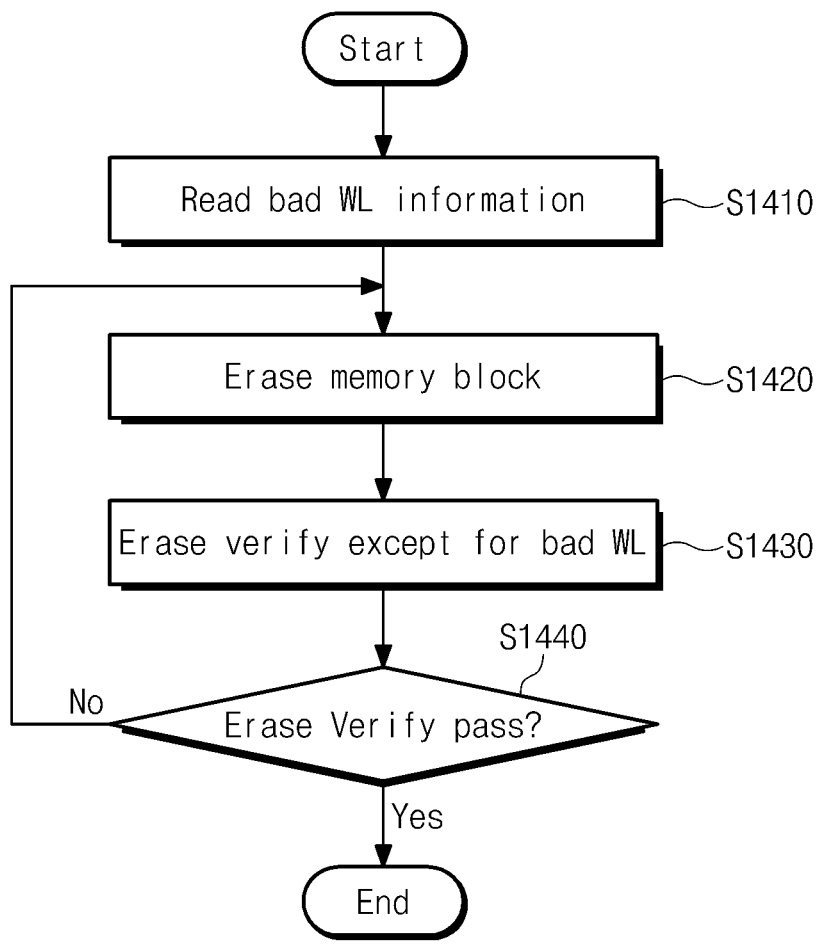
FIG. 14 is a flow chart illustrating a memory block erasing management method of a data storage device according to an embodiment of the inventive concepts.

FIG. 14 is a flow chart illustrating a memory block erasing management method of a data storage device according to an embodiment of the inventive concepts.

In operation S1410, a flash memory 1100 may read bad word line information. The flash memory 1100 may read bad word line information using various methods. For example, before a memory controller 1200 provides an erase command to the flash memory 1100, a bad page manager 1260 may provide bad word line information to the flash memory 1100. Alternatively, the flash memory 1100 may previously store bad word line information, and may read the stored bad word line information after an erase command is received.

In operation S1420, the flash memory 1100 may perform an erase operation on a memory block in response to the erase command. The flash memory 1100 may apply a voltage of 0V to word lines WL1 to WL8 and an erase voltage Verase (e.g., about 20V) to a substrate SUB.

In operation S1430, an erase verification operation may be performed to determine whether memory cells have threshold voltages corresponding to an erase state EU (refer to FIG. 6).

At this time, the flash memory 1100 may provide an erase verification voltage to the remaining word lines except for a bad word line. A voltage (e.g., Vread) for preventing erase verification fail may be applied to the bad word line.

In operation S1440, the flash memory 1100 may determine whether the erase verification result indicates erase pass. If the erase verification result is determined to indicate erase fail, the method may proceed to operation S1420. If the erase verification result is determined to indicate erase pass, the method may end.

Figure 15:
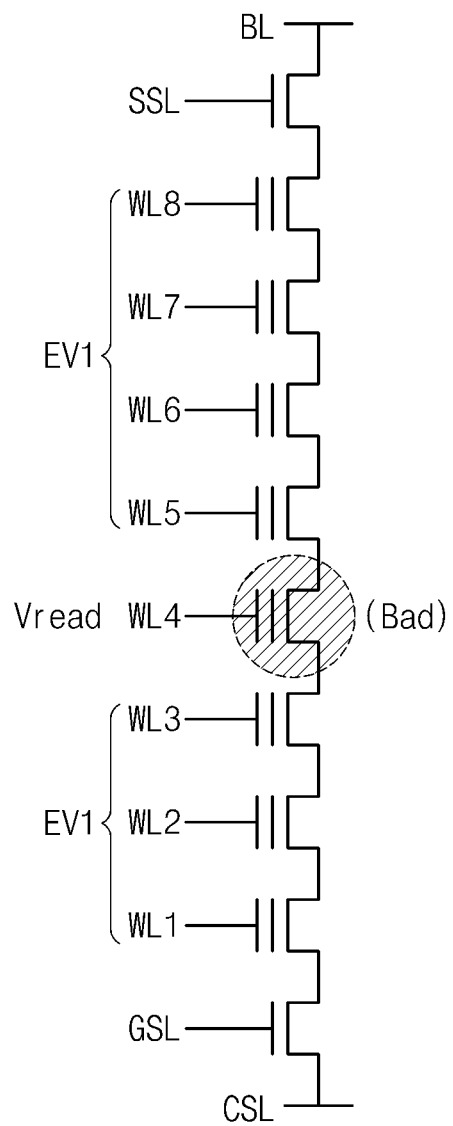
FIGS. 15 to 17 are diagrams describing an erase verification voltage applied to a word line at an erase verification operation.
Figure 16:
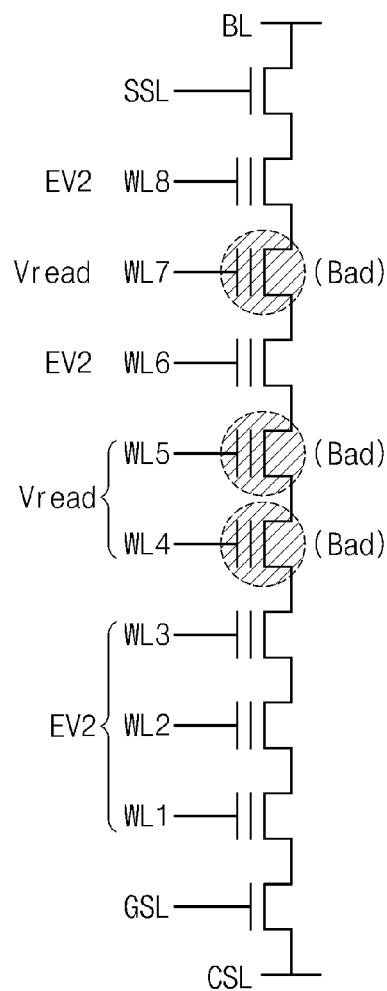
Figure 17:
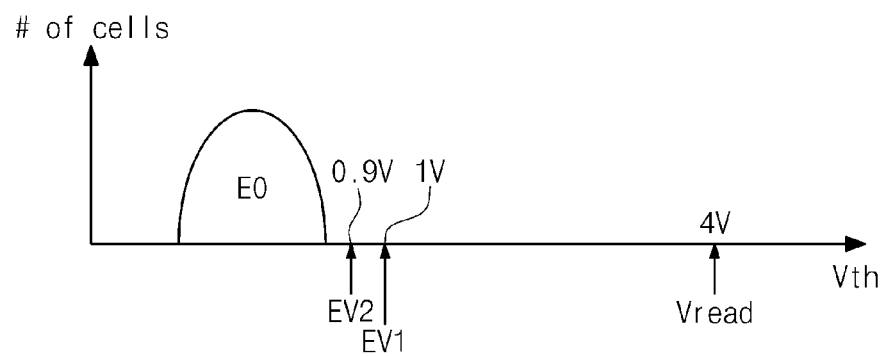

FIGS. 15 to 17 are diagrams describing an erase verification voltage applied to a word line at an erase verification operation.

FIG. 15 shows an erase verification voltage applied to each word line in a case where a bad word line exists. At an erase verification operation, a voltage (e.g., Vread) may be applied to a bad word line WL4 such that an erase verification result indicates erase pass always. A first erase verification voltage EV1 may be applied to word lines WL1 to WL3 and WL5 to WL8. Referring to FIG. 17, the erase verification voltage Vread applied to the bad word line WL4 may be about 4V, and the first erase verification voltage EV1 applied to word lines WL1 to WL3 and WL5 to WL8 may be about 1V.

FIG. 16 shows an erase verification voltage applied to each word line in a case where a plurality of bad word lines exists. If several bad word lines exist, an erase verification result may be different from an actual erase verification result. Thus, an erase verification voltage provided to the remaining word lines except for bad word lines may be changed according to the number of bad word lines or their locations.

Referring to FIG. 16, word lines WL4, WL5 and WL7 may be bad word lines (i.e., word lines associated with bad pages). At an erase verification operation, a read voltage Vread may be applied to the bad word lines WL4, WL5 and WL7, and a second erase verification voltage EV2 may be applied to the remaining word lines WL1 to WL3, WL6, and WL8. The second erase verification voltage EV2 may be different from a first erase verification voltage EV1 of FIG. 15 (e.g., lower).

Referring to FIG. 17, the read voltage Vread applied to the bad word lines WL4, WL5 and WL7 may be about 4V, and the second erase verification voltage EV2 applied to the remaining word lines WL1 to WL3, WL6, and WL8 may be about 0.9V. If the number of bad word lines increases, a threshold voltage distribution characteristic may deteriorate at an erase operation. The second erase verification voltage EV2 may instead be higher than the first erase verification voltage EV1 to improve accuracy of a threshold voltage distribution.

As understood from the above description, a data storage device 1000 (refer to FIG. 1) according to an embodiment of the inventive concepts may not perform a bad block management operation by the memory block unit, but a bad page management operation by the page unit. Thus, data loss may be reduced and a memory may be efficiently used. A bad page manager 1260 may obtain bad page information from a flash memory 1100 or from the memory controller 1200 to perform bad page management on the flash memory 1100.

The bad page manager 1260 may have a bad page management table for bad page management. The bad page manager 1260 may manage a page, which is formed at the same height or layer as a bad page and is connected with the same word line, as a weak page. Meanwhile, the data storage device 1000 may prevent erase verification fail due to a bad word line by applying a desired (or, alternatively a predetermined) voltage (e.g., Vread) to the bad word line connected with a bad page at an erase verification operation.

Applications

A data storage device according to an embodiment of the inventive concepts may be applied or provided to various products. The data storage device according to an embodiment of the inventive concepts may be implemented by electronic devices such as a personal computer, a digital camera, a camcorder, a cellular phone, an MP3 player, a PMP, a PSP, a PDA, and the like as well as storage devices such as a memory card, an USB memory, a solid state drive (hereinafter, referred to as SSD), and the like.

Figure 18:
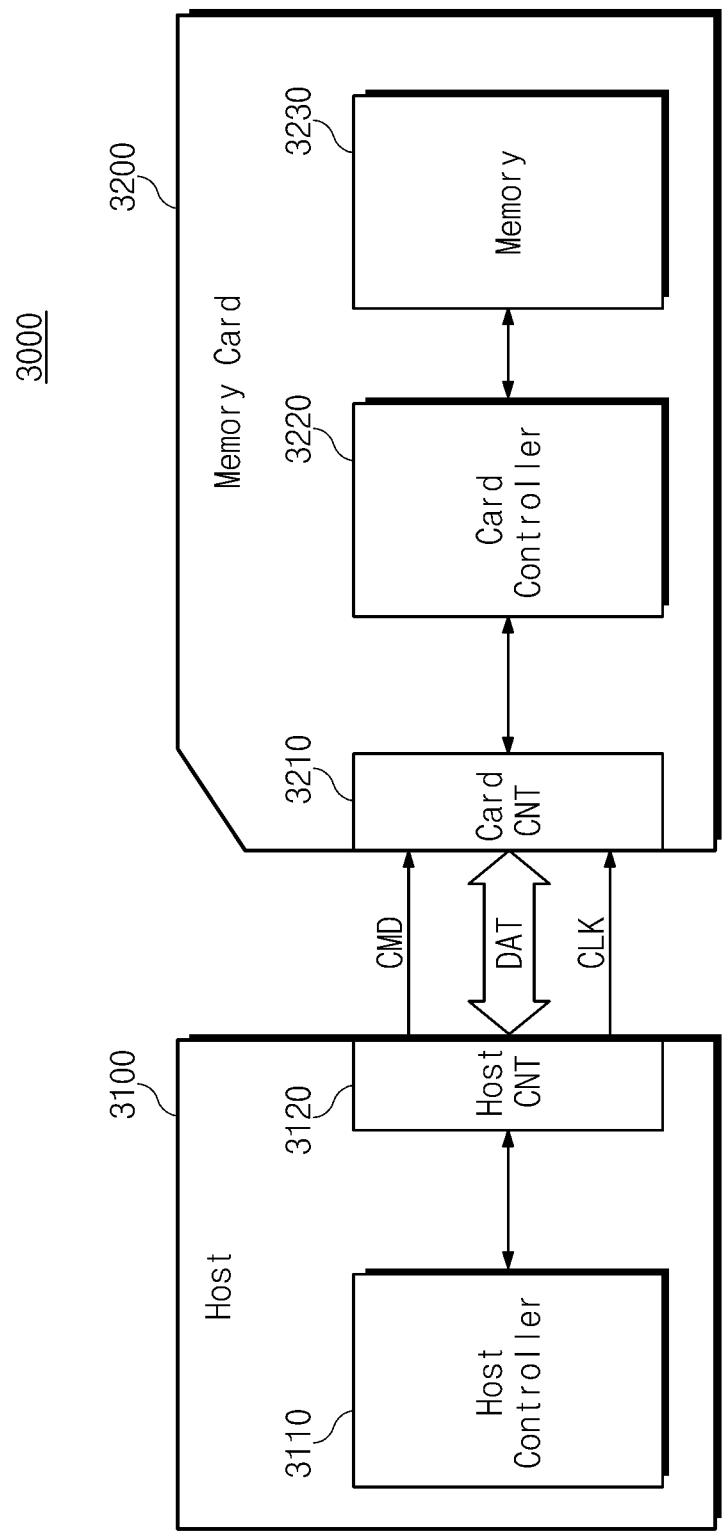
FIG. 18 is a block diagram schematically illustrating a memory card to which a data storage device according to an embodiment of the inventive concepts is applied.

FIG. 18 is a block diagram schematically illustrating a memory card to which a data storage device according to an embodiment of the inventive concepts is applied. A memory card system 3000 may include a host 3100 and a memory card 3200. The host 3100 may include a host controller 3110 and a host connection unit 3120. The memory card 3200 may include a card connection unit 3210, a card controller 3220, and a flash memory 3230. Herein, the flash memory 3230 may be implemented by a three-dimensional flash memory as described above.

The host 3100 may write data at the memory card 3200 and read data from the memory card 3200. The host controller 3110 may send a command (e.g., a write command), a clock signal CLK generated from a clock generator (not shown) in the host 3100, and data to the memory card 3200 through the host connection unit 3120.

The card controller 3220 may store data at the flash memory 3230 in response to a command input through the card connection unit 3210. The data may be stored in synchronization with a clock signal generated from a clock generator (not shown) in the card controller 3220. The flash memory 3230 may store data transferred from the host 3100. For example, in a case where the host 3100 is a digital camera, the memory card 3200 may store image data.

The card controller 3220 and the memory 3230 may be implemented using the controller 1200 and the memory 1100.

Figure 19:
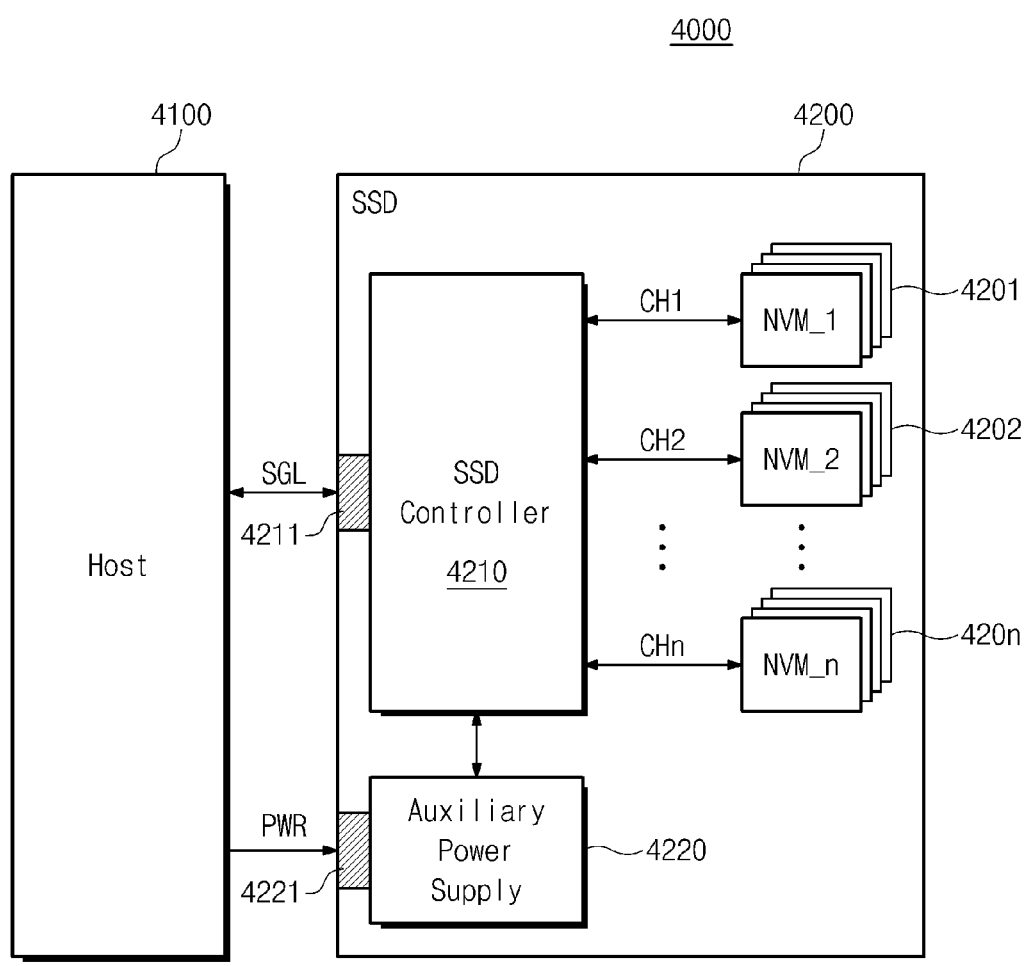
FIG. 19 is a block diagram illustrating a solid state drive system in which a data storage device according to the inventive concepts is applied.

FIG. 19 is a block diagram illustrating a solid state drive system in which a data storage device according to the inventive concepts is applied. Referring to FIG. 19, a solid state drive (SSD) system 4000 may include a host 4100 and an SSD 4200.

The SSD 4200 may exchange signals SGL with the host 4100 through a signal connector 4211, and may be supplied with power through a power connector 4221. The SSD 4200 may include a plurality of flash memories 4201 to 420n, an SSD controller 4210, and an auxiliary power supply 4220.

The plurality of nonvolatile memories 4201 to 420n may be used as a storage medium of the SSD 4200. The SSD 4200 may employ other nonvolatile memory devices such as PRAM, MRAM, ReRAM, or the like other than the flash memory. The plurality of nonvolatile memories 4201 to 420n may be connected with the SSD controller 4210 through a plurality of channels CH1 to CHn. One channel may be connected with one or more flash memories. Flash memories connected with one channel may be connected with the same data bus.

The SSD controller 4210 may exchange signals SGL with the host 4100 through the signal connector 4211. Herein, the signals SGL may include a command, an address, data, and the like. The SSD controller 4210 may be configured to write or read out data to or from a corresponding flash memory according to a command of the host 4100. The SSD controller 4210 will be more fully described with reference to FIG. 20.

The auxiliary power supply 4220 may be connected with the host 4100 through the power connector 4221. The auxiliary power supply 4220 may be charged by a power PWR from the host 4100. The auxiliary power supply 4220 may be placed inside or outside the SSD 4200. For example, the auxiliary power supply 4220 may be put on a main board to supply an auxiliary power to the SSD 4200.

Figure 20:
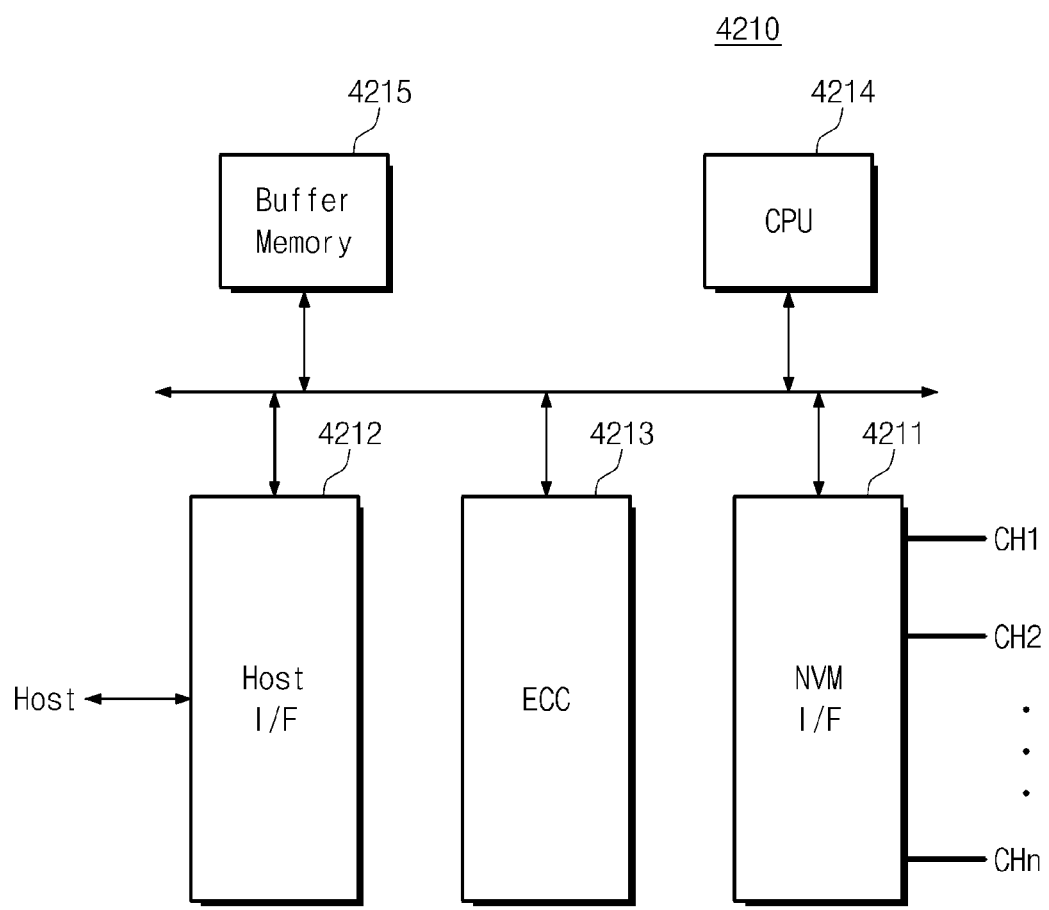
FIG. 20 is a block diagram schematically illustrating an SSD controller in FIG. 19.

FIG. 20 is a block diagram schematically illustrating an SSD controller in FIG. 19. Referring to FIG. 20, an SSD controller 4210 may include an NVM interface 4211, a host interface 4212, an ECC circuit 4213, a CPU 4214, and a buffer memory 4215.

The NVM interface 4211 may scatter data transferred from the buffer memory 4215 to channels CH1 to CHn, respectively. The NVM interface 4211 may transfer data read from flash memories 4201 to 420n to the buffer memory 4215. Herein, the NVM interface 4211 may use a flash memory interface. That is, the SSD controller 4210 may perform reading, writing and erasing according to the manner of a flash memory interface.

The host interface 4212 may provide an interface with an SSD 4200 according to the protocol of the host 4100. The host interface 4212 may communicate with the host 4100 using USB (Universal Serial Bus), SCSI (Small Computer System Interface), PCI express, ATA, PATA (Parallel ATA), SATA (Serial ATA), SAS (Serial Attached SCSI), or the like. The host interface 4212 may also perform a disk emulation function which enables the host 4100 to recognize the SSD 4200 as a hard disk drive (HDD).

The ECC circuit 4213 may generate an error correction code ECC using data transferred to the flash memory 4201 to 420n. The error correction code ECC thus generated may be stored at a spare area of the flash memory 4201 to 420n. The ECC circuit 4213 may detect an error of data read from the flash memory 4201 to 420n. If the detected error is correctable, the ECC circuit 4213 may correct the detected error.

The CPU 4214 may analyze and process signals received from a host 4100 (refer to FIG. 19). The CPU 4214 may control the host 4100 or the flash memories 4201 to 420n through the host interface 4212 or the NVM interface 4211. The CPU 4214 may control the flash memories 4201 to 420n according to firmware for driving an SSD 4200.

The buffer memory 4215 may temporarily store write data provided from the host 4100 or read from a flash memory. Also, the buffer memory 4215 may store metadata or cache data to be stored at the flash memories 4201 to 420n. At a sudden power-off operation, metadata or cache data stored at the buffer memory 4215 may be stored at the flash memories 4201 to 420n. The buffer memory 4215 may be formed of a DRAM, an SRAM, or the like.

The CPU 4214 may implement the management methods described above with respect to the memories 4201 to 420n.

Figure 21:
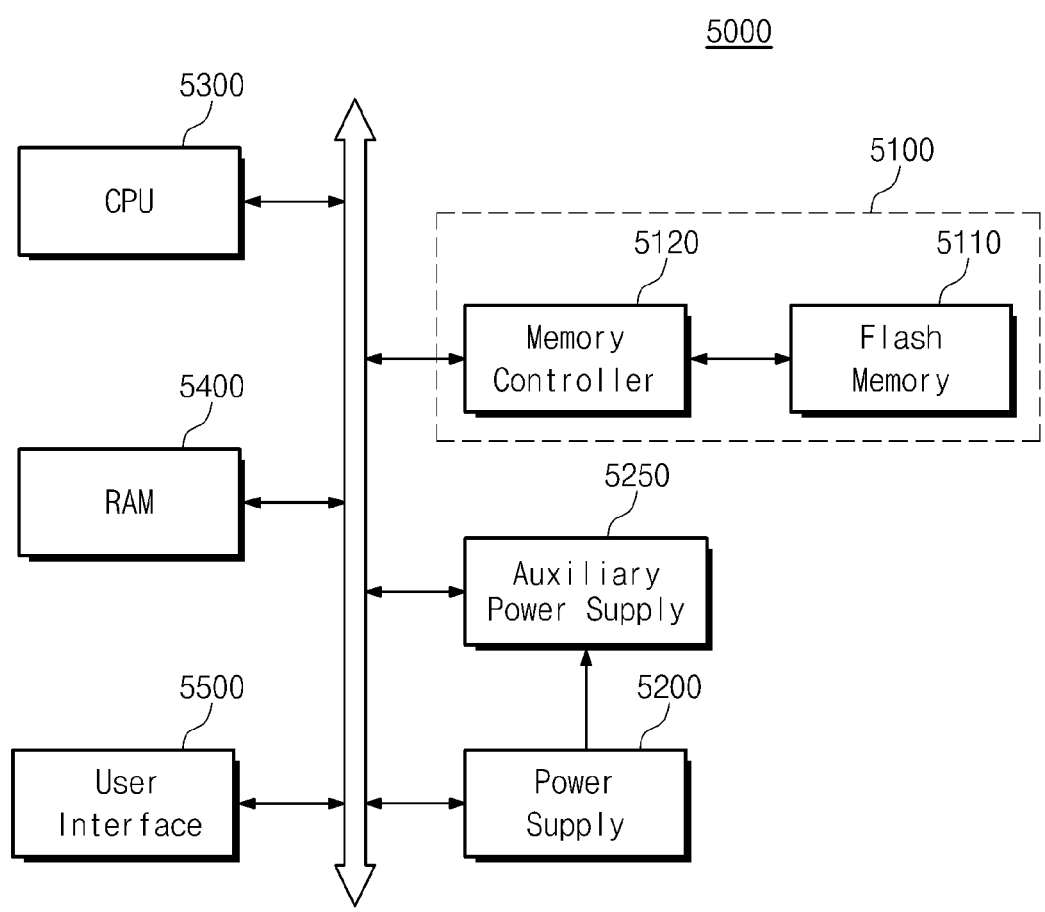
FIG. 21 is a block diagram schematically illustrating an electronic device implemented using a data storage device according to an embodiment of the inventive concepts.

FIG. 21 is a block diagram schematically illustrating an electronic device implemented using a data storage device according to an embodiment of the inventive concept. Herein, an electronic device 5000 may be a personal computer or a handheld electronic device such as a notebook computer, a cellular phone, a PDA, a camera, or the like.

Referring to FIG. 21, the electronic device 5000 may include a memory system 5100, a power supply device 5200, an auxiliary power supply 5250, a CPU 5300, a RAM 5400, and a user interface 5500. The memory system 5100 may include a flash memory 5110 and a memory controller 5120. The memory controller 5120 and the memory 5110 may be implemented using the controller 1200 and the memory 1100.

While the inventive concepts have been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a memory controller, comprising:
determining, at the memory controller, a status of a selected page of memory based on a program/erase cycle count for a block of the memory, the block of the memory including the selected page, the program/erase cycle count indicating a number of times the block has been erased, and the status selected from a plurality of status states, the status states including a normal state, a weak state and a bad state.

2. The method of claim 1, further comprising:
performing the determining after a program operation on the selected page.

3. The method of claim 2, wherein the determining determines the status state of the selected page based on a loop count and the program/erase cycle count if the program operation is successful, the loop count indicating a number of program loops executed during the program operation.

4. The method of claim 3, wherein the determining determines the status state of the selected page as the weak state if the loop count is greater than a first threshold and the program/erase cycle count is less than a second threshold.

5. The method of claim 2, wherein the determining determines the status state of the selected page based on an error correction indicator and the program/erase cycle count if the program operation is successful, the error correction indicator indicating an number of bit errors associated with the selected page.

6. The method of claim 5, wherein the determining determines the status state of the page as the weak state if the error correction indicator is greater than a first threshold and the program/erase cycle count is less than a second threshold.

7. The method of claim 2, wherein the determining includes determining the status states of pages related to the selected page based on the program/erase cycle count if the program operation fails, the related pages being at a same layer and in the block of the selected page.

8. The method of claim 7, wherein the determining determines the status states of the related pages as the weak state if the program/erase cycle count is greater than or equal to a threshold.

9. The method of claim 8, wherein the determining determines the status state of the selected page as the bad state if the program/erase cycle count greater than or equal to the threshold.

10. The method of claim 7, wherein the determining determines the status states of the related pages as the bad state if the program/erase cycle count less than a threshold.

11. The method of claim 10, wherein the determining determines the status state of the selected page as the bad state if the program/erase cycle count is less than the threshold.

12. The method of claim 1, wherein the determining determines the status state of the selected page as the weak state if a program condition is met and the program/erase cycle count is less than a threshold.

13. The method of claim 12, wherein the program condition is based on a loop count, the loop count indicating a number of program loops executed during a successful program operation of the selected page.

14. The method of claim 12, wherein the program condition is based on an error correction indicator, the error correction indicator indicating a number of bit errors associated with the selected page after a successful program operation on the selected page.

15. The method of claim 1, wherein the determining includes determining the status states of pages related to the selected page based on the program/erase cycle count if a program condition is met, the related pages being at a same layer and in the block of the selected page.

16. The method of claim 15, wherein the program condition is based on a loop count, the loop count indicating a number of program loops executed during a program operation of the selected page.

17. The method of claim 1, further comprising:
managing the memory based on the determined status of the selected page.

18. The method of claim 17, wherein the managing includes closing the selected page if the determining determines the status state of the selected page is the weak state, the closing permitting reading of the closed page and prohibiting writing of the closed page.

19. The method of claim 18, wherein the closed page is not read if the closed page is an erased page.

20. The method of claim 17, wherein the managing includes copying data of the selected page to a new page and inhibiting further access to the selected page if the determining determines the status state of the selected page is the bad state.

21. The method of claim 17, wherein the managing includes performing an erase verify operation on an erased block including the selected page based on the determined status of the selected page, the erase verify operation including applying voltages to word lines of the erased block based on the determined status of the selected page.

22. The method of claim 21, wherein the erase verify operation includes applying a different voltage to word lines associated with at least one page having the bad state than applied to word lines associated with pages not having the bad state.

23. The method of claim 22, wherein the erase verify operation includes applying a first voltage to word lines associated with at least one page having the bad state that is greater than a second voltage applied to word lines associated with no pages having the bad state.

24. The method of claim 21, wherein the erase verify operation includes applying a first voltage to word lines associated with no pages having the bad state in the erased block if the number of word lines associated with at least one page having the bad state in the erased block is less than a threshold number, and the erase verify operation includes applying a second voltage to word lines associated with no pages having the bad state in the erased block if the number of word lines associated with at least one page having the bad state in the erased block is greater than or equal to the threshold number, and the second voltage is less than first voltage.

25. The method of claim 24, wherein the erase verify operation includes applying a third voltage to word lines associated with at least one page having the bad state in the erased block, and the third voltage is greater than the first and second voltages.

26. A data storage device, comprising:
a memory having a plurality of memory cells divided into blocks, and the blocks having a three dimensional structure, the three dimensional structure including,
a plurality of strings of memory cells arranged in an array of columns and rows on a substrate, each of the plurality of strings extending substantially perpendicular to the substrate and each of the plurality of strings including a plurality of memory cells connected in series, the plurality of memory cells of each of the plurality of strings at different vertical layers,
a plurality of word lines, the plurality of word lines arranged at the different vertical layers such that each of the plurality of word lines is associated with memory cells at a same one of the vertical layers, a row of memory cells in different strings at the same one of the vertical layers forming a page,
a plurality of bit lines, each of the plurality of bit lines connected to a respective column of the plurality of strings; and
a memory controller configured to determine a status of a selected page based on a program/erase cycle count for the one of the blocks including the selected page, the program/erase cycle count indicating a number of times the block has been erased, and the status selected from a plurality of status states, the status states including a normal state, a weak state and a bad state.

27. The data storage device of claim 26, wherein the memory controller is configured to set pages related to a bad page to the weak state, the bad page having the bad state, the related pages being pages in a same block and at a same vertical layer as the bad page.

28. The data storage device of claim 27, wherein the pages at a same vertical layer in the same block are connected to a same word line.

29. The data storage device of claim 28, wherein at least two of the pages at a same vertical layer in the same block are connected to different word lines.

30. A data storage device, comprising:
a memory having a plurality of memory cells divided into blocks, and the blocks of memory cells being divided into pages; and
a memory controller configured to obtaining bad page information, the bad page information indicating which pages in the memory are bad pages;
the memory controller configured to perform an erase verify operation on an erased block of the memory based on the bad page information, the erase verify operation including applying a different voltage to word lines associated with at least one bad page than applied to word lines associated with no bad pages.

31. The data storage device of claim 30, wherein a first voltage applied to word lines associated with at least one bad page during the erase verify operation is greater than a second voltage applied to word lines associated with no bad pages during the erase verify operation.

32. The data storage device of claim 30, wherein the erase verify operation includes applying a first voltage to word lines associated with no bad pages in the erased block if the number of word lines associated with at least one bad page in the erased block is less than a threshold number, and the erase verify operation includes applying a second voltage to word lines associated with no bad pages in the erased block if the number of word lines associated with at least one bad page in the erased block is greater than or equal to the threshold number, and the second voltage is less than first voltage.

33. The data storage device of claim 32, wherein the erase verify operation includes applying a third voltage to word lines associated with at least one bad page in the erased block, and the third voltage is greater than the first and second voltages.

* * * * *